United States Patent
Li et al.

(10) Patent No.: US 7,908,743 B2
(45) Date of Patent: Mar. 22, 2011

(54) METHOD FOR FORMING AN ELECTRICAL CONNECTION

(75) Inventors: Zhiyong Li, San Jose, CA (US); Chuck Luu, Fremont, CA (US); Gopalakrishna B. Prabhu, San Jose, CA (US); Danny Cam Toan Lu, San Francisco, CA (US); Garry Kwong, San Jose, CA (US); David Tanner, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 44 days.

(21) Appl. No.: 12/430,807

(22) Filed: Apr. 27, 2009

(65) Prior Publication Data

US 2009/0277006 A1 Nov. 12, 2009

Related U.S. Application Data

(63) Continuation-in-part of application No. 12/394,616, filed on Feb. 27, 2009.

(60) Provisional application No. 61/032,005, filed on Feb. 27, 2008.

(51) Int. Cl.
*H05K 3/36* (2006.01)

(52) U.S. Cl. .............. 29/830; 29/825; 29/832; 136/256; 136/258

(58) Field of Classification Search .................... 29/825, 29/830, 832; 136/256, 258
See application file for complete search history.

(56) References Cited

U.S. PATENT DOCUMENTS 4,532,372 A * 7/1985 Nath et al. ..................... 136/256
(Continued)

FOREIGN PATENT DOCUMENTS

JP 2001-180822 A 7/2001
(Continued)

OTHER PUBLICATIONS

Detlev Koch-Ospelt. "End-to-End Mass Production Solutions for Gen 1 & 2 Silicon Thin Film Modules". Power Point. Jun. 13, 2007.
(Continued)

*Primary Examiner* — C. J Arbes
(74) *Attorney, Agent, or Firm* — Patterson & Sheridan, LLP

(57) ABSTRACT

Embodiments of the present invention provide a method of forming an electrical connection on a device. In one embodiment, the electrical connection is attached to the device via an adhesive having electrically conductive particles disposed therein. In one embodiment, the adhesive is cured while applying pressure such that the conductive particles align, have a reduced particle-to-particle spacing, or come into contact with each other to provide a more directly conductive (less resistive) path between the electrical connection and the device. In one embodiment of the present invention, a method for forming an electrical lead on a partially formed solar cell during formation of the solar cell device is provided. The method comprises placing a side-buss wire onto a pattern of electrically conductive adhesive disposed on a back contact layer of a solar cell device substrate, laminating the side-buss wire and electrically conductive adhesive between the solar cell device substrate and a back glass substrate to form a composite solar cell structure, and curing the electrically conductive adhesive while applying pressure and heat to the composite solar cell structure.

19 Claims, 14 Drawing Sheets

U.S. PATENT DOCUMENTS

| | | | |
|---|---|---|---|
| 4,590,327 A * | 5/1986 | Nath et al. | 136/256 |
| 4,633,034 A * | 12/1986 | Nath et al. | 136/256 |
| 4,773,944 A | 9/1988 | Nath et al. | |
| 5,084,107 A * | 1/1992 | Deguchi et al. | 136/256 |
| 5,181,968 A * | 1/1993 | Nath et al. | 136/256 |
| 6,077,722 A | 6/2000 | Jansen et al. | |
| 6,107,920 A * | 8/2000 | Eberhardt et al. | 340/572.7 |
| 6,256,549 B1 | 7/2001 | Romero et al. | |
| 6,265,242 B1 | 7/2001 | Komori et al. | |
| 6,288,325 B1 | 9/2001 | Jansen et al. | |
| 6,384,727 B1 * | 5/2002 | Diprizio et al. | 340/572.7 |
| 6,423,565 B1 | 7/2002 | Barth et al. | |
| 6,455,347 B1 | 9/2002 | Hiraishi et al. | |
| 6,784,361 B2 | 8/2004 | Carlson et al. | |
| 6,841,728 B2 | 1/2005 | Jones et al. | |
| 7,294,298 B2 * | 11/2007 | Iijima | 264/112 |
| 7,432,438 B2 | 10/2008 | Rubin et al. | |
| 7,732,243 B2 * | 6/2010 | Luch | 438/57 |
| 2003/0044539 A1 | 3/2003 | Oswald | |
| 2003/0127128 A1 | 7/2003 | Fabick et al. | |
| 2003/0129810 A1 | 7/2003 | Barth et al. | |
| 2005/0072455 A1 | 4/2005 | Gerhardinger et al. | |
| 2005/0241692 A1 | 11/2005 | Rubin et al. | |
| 2005/0252545 A1 | 11/2005 | Nowlan et al. | |
| 2006/0068134 A1 * | 3/2006 | Iijima | 428/32.69 |
| 2007/0056626 A1 | 3/2007 | Funcell | |
| 2009/0038675 A1 * | 2/2009 | Tsunomura et al. | 136/251 |
| 2009/0077805 A1 | 3/2009 | Bachrach et al. | |

FOREIGN PATENT DOCUMENTS

| | | |
|---|---|---|
| JP | 2004-153137 A | 5/2004 |
| JP | 2004-335680 A | 11/2004 |
| JP | 2005-235916 A | 9/2005 |
| JP | 2006-088511 A | 4/2006 |
| WO | 2009/029901 A1 | 3/2009 |
| WO | 2009/029902 A1 | 3/2009 |

OTHER PUBLICATIONS

International Search Report and Written Opinion dated Sep. 30, 2010 for PCT International Application No. PCT/US2009/035579.
International Search Report and Written Opinion dated Nov. 10, 2010 for International Application No. PCT/US2010/030114.

* cited by examiner

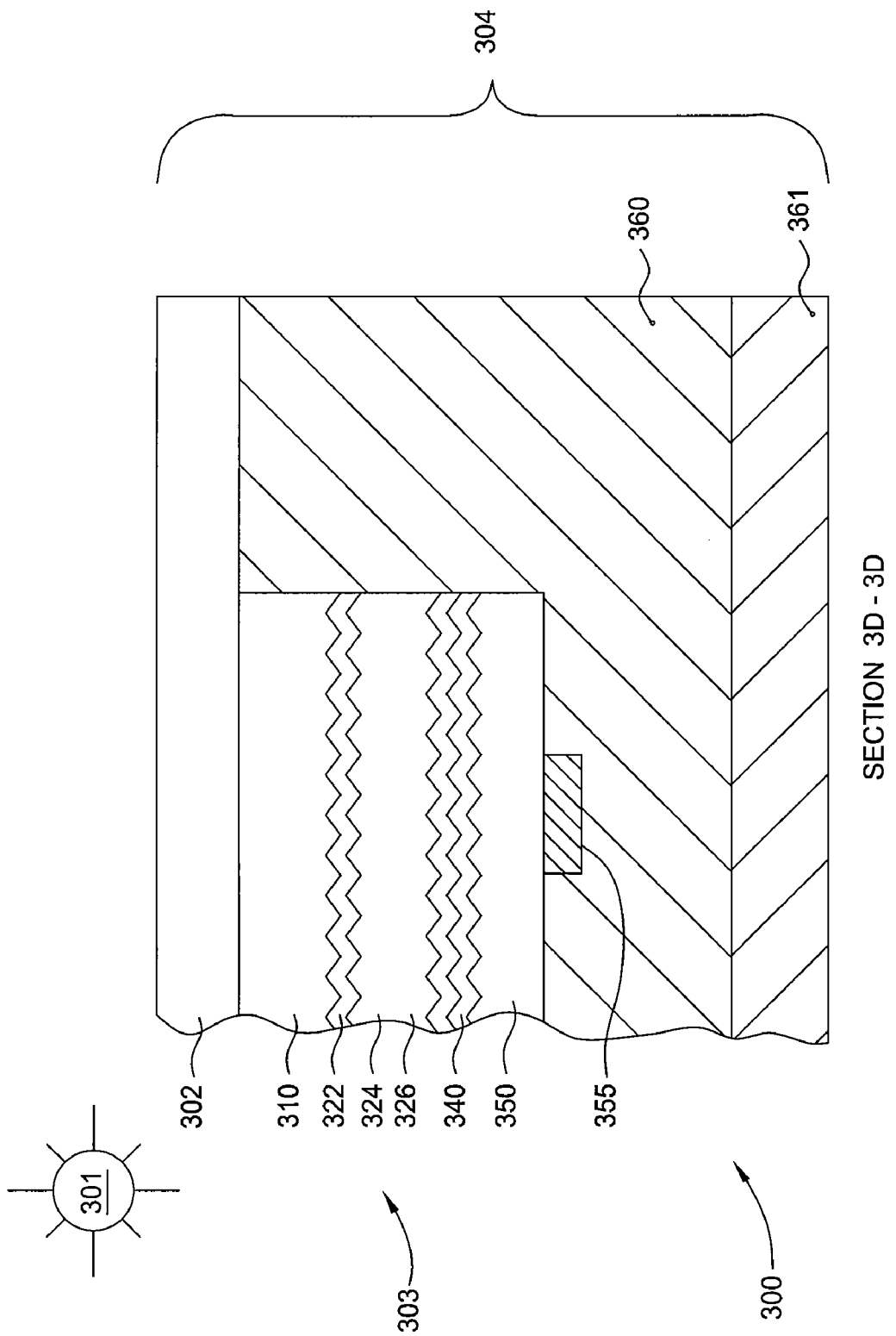

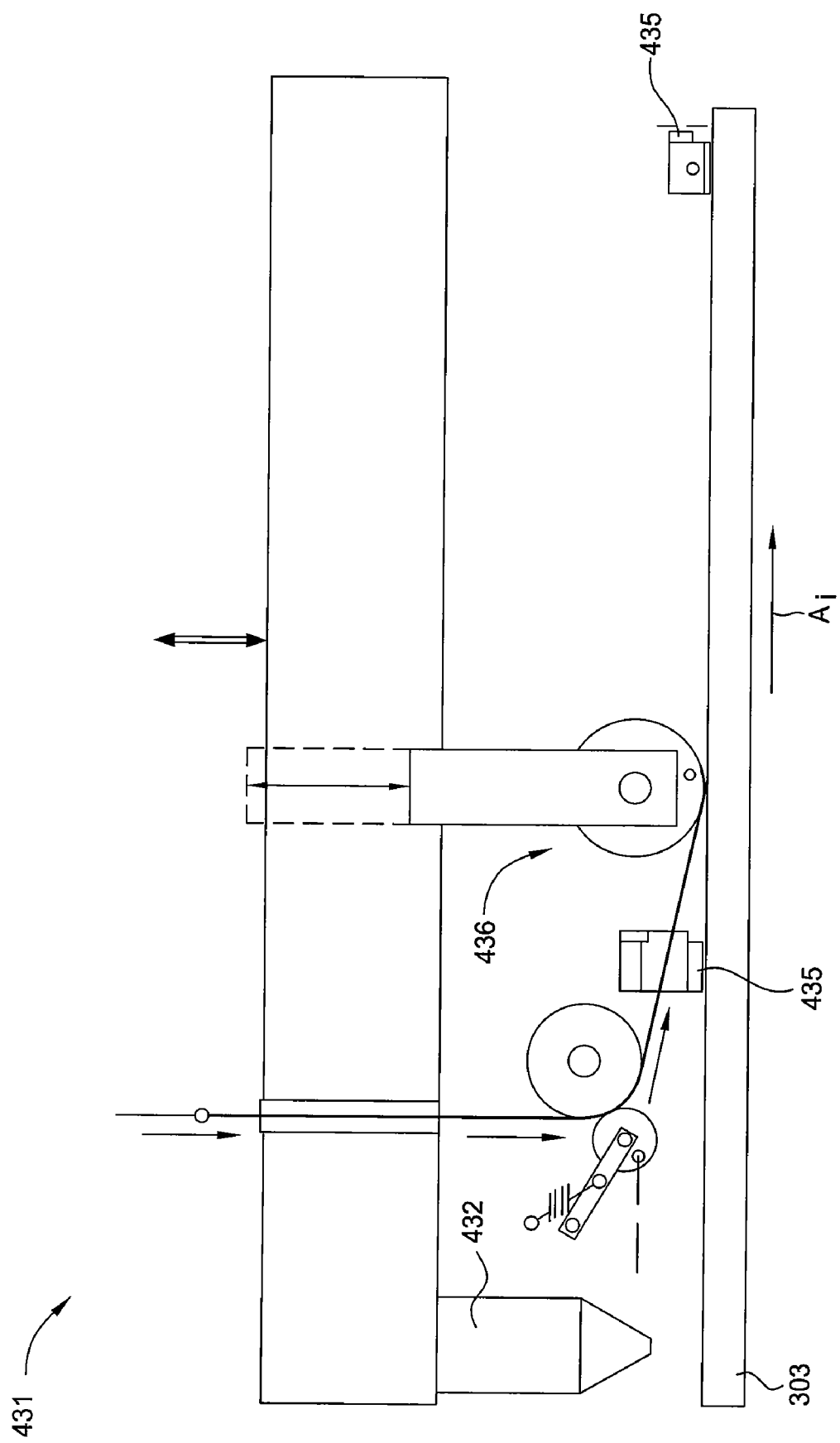

METHOD FOR FORMING AN ELECTRICAL CONNECTION

CROSS-REFERENCE TO RELATED APPLICATIONS

This application is a continuation in part of U.S. application Ser. No. 12/394,616, filed Feb. 27, 2009, which claims benefit of U.S. provisional patent application Ser. No. 61/032,005, filed Feb. 27, 2008, both of which are herein incorporated by reference.

BACKGROUND OF THE INVENTION

1. Field of the Invention

Embodiments of the present invention generally relate to a method for forming an electrical connection using an electrically conductive adhesive.

2. Description of the Related Art

Photovoltaic (PV) devices or solar cells are devices which convert sunlight into direct current (DC) electrical power. Typical thin film type PV devices, or thin film solar cells, have one or more p-i-n junctions. Each p-i-n junction comprises a p-type layer, an intrinsic type layer, and an n-type layer. When the p-i-n junction of the solar cell is exposed to sunlight (consisting of energy from photons), the sunlight is converted to electricity through the PV effect. Solar cells may be tiled into larger solar arrays. The solar arrays are created by connecting a number of solar cells and joining them into panels with specific frames and connectors.

Typically, a thin film solar cell includes active regions, or photoelectric conversion units, and a transparent conductive oxide (TCO) film disposed as a front electrode and/or as a backside electrode. The photoelectric conversion unit includes a p-type silicon layer, an n-type silicon layer, and an intrinsic type (i-type) silicon layer sandwiched between the p-type and n-type silicon layers. Several types of silicon films, including microcrystalline silicon film (μc-Si), amorphous silicon film (a-Si), polycrystalline silicon film (poly-Si), and the like, may be utilized to form the p-type, n-type, and/or i-type layers of the photoelectric conversion unit. The backside electrode may contain one or more conductive layers. There is a need for an improved process of forming a solar cell that has good interfacial contact, low contact resistance, and high overall performance.

With traditional energy source prices on the rise, there is a need for a low cost way of producing electricity using a low cost solar cell device. Conventional solar cell manufacturing processes are highly labor intensive and have numerous interruptions that can affect the production line throughput, solar cell cost, and device yield. For instance, conventional solar cell electrical connection processes require formed electrical leads to be manually positioned and connected to the backside electrode of the solar cell device. These manual processes are labor intensive, time consuming and costly. Additionally, conventional solar cell electrical connection processes, such as soldering, may result in damage to the solar cell due to high localized heating during the electrical lead attachment process.

Therefore, there is a need for improved methods of forming an electrical connection, such as on a solar cell in an automated solar cell production line.

SUMMARY OF THE INVENTION

In one embodiment of the present invention, a method of forming an electrical connection comprises dispensing an electrically conductive adhesive onto a surface of a first conductive member, positioning a second conductive member onto the electrically conductive adhesive to form a composite structure, compressing the composite structure at a pressure substantially exceeding atmospheric pressure, and curing the electrically conductive adhesive during the compressing the composite structure.

In another embodiment, a method of forming an electrical connection comprises dispensing an electrically conductive adhesive onto a surface of a back contact layer of a solar cell substrate, wherein the solar cell substrate comprises a glass substrate, a transparent conductive layer deposited over the glass substrate, one or more silicon layers deposited over the transparent conductive layer, and a back contact layer deposited over the one or more silicon layers, positioning a portion of a side-buss onto a portion of the electrically conductive adhesive, positioning a polymeric material over the back contact layer and the side-buss wire, disposing a back glass substrate over the polymeric material to form a composite structure, compressing the composite structure at a pressure substantially exceeding atmospheric pressure, and curing the electrically conductive adhesive during the compressing the composite structure.

In yet another embodiment of the present invention, a method of forming an electrical connection comprises dispensing an electrically conductive adhesive onto a surface of a back contact layer of a solar cell substrate in a bonding wire attach module of a solar cell production line, wherein the solar cell substrate comprises a glass substrate, a transparent conductive layer deposited over the glass substrate, one or more silicon layers deposited over the transparent conductive layer, a back contact layer deposited over the one or more silicon layers, and a cross-buss disposed over the back contact layer such that the cross-buss is insulated from the back contact layer, positioning a portion of a side-buss onto a portion of the electrically conductive adhesive, dispensing a polymeric material over the back contact layer and the side-buss, disposing a back glass substrate over the polymeric material to form a composite structure, compressing the composite structure at a pressure substantially exceeding atmospheric pressure, curing the electrically conductive adhesive during the compressing the composite structure in an autoclave module of the solar cell production line, and controlling the timing between the dispensing the electrically conductive adhesive and the curing via a system controller in the solar cell production line. In one embodiment, the conductive adhesive comprises an epoxy having conductive particles dispersed therein.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3D is a side cross-sectional view along Section A-A of FIG. 3C.

FIG. 4B is a side view of a portion of a side-buss depositing element and a soldering module according to one embodiment of the present invention.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present invention provide a method of forming an electrical connection on a device. In one embodiment, the electrical connection is attached to the device via an adhesive having electrically conductive particles disposed therein. In one embodiment, the adhesive is cured while applying pressure such that the conductive particles align, have a reduced particle-to-particle spacing, or come into contact with each other to provide a more directly conductive (less resistive) path between the electrical connection and the device.

In one embodiment of the present invention, a method for forming an electrical lead on a partially formed solar cell during formation of the solar cell device is provided. The method comprises placing a side-buss wire onto a pattern of electrically conductive adhesive disposed on a back contact layer of a solar cell device substrate, laminating the side-buss wire and electrically conductive adhesive between the solar cell device substrate and a back glass substrate to form a composite solar cell structure, and curing the electrically conductive adhesive while applying pressure and heat to the composite solar cell structure.

Figure 1:
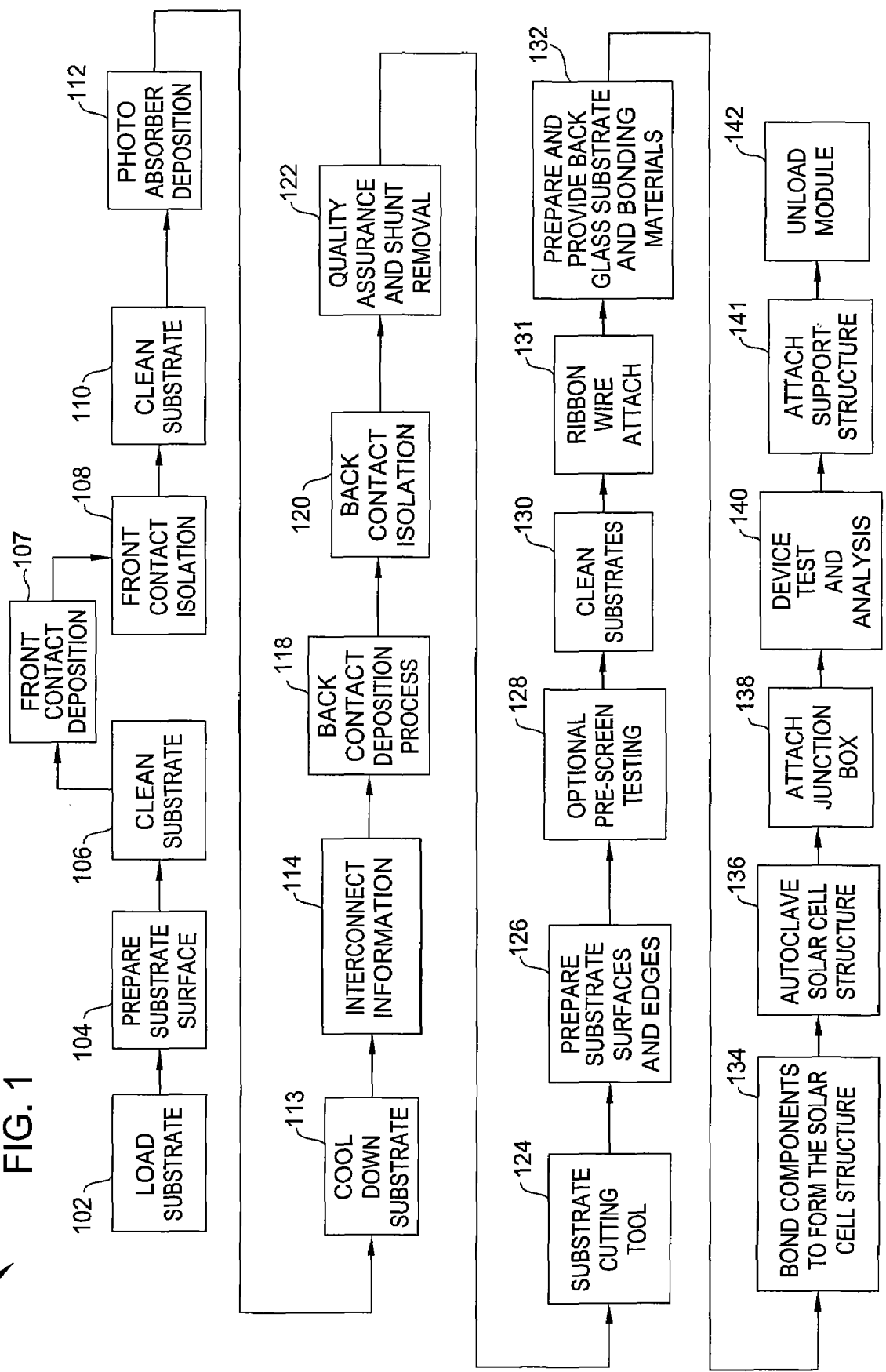
FIG. 1 illustrates a process sequence for forming a solar cell device according to one embodiment described herein.
Figure 2:
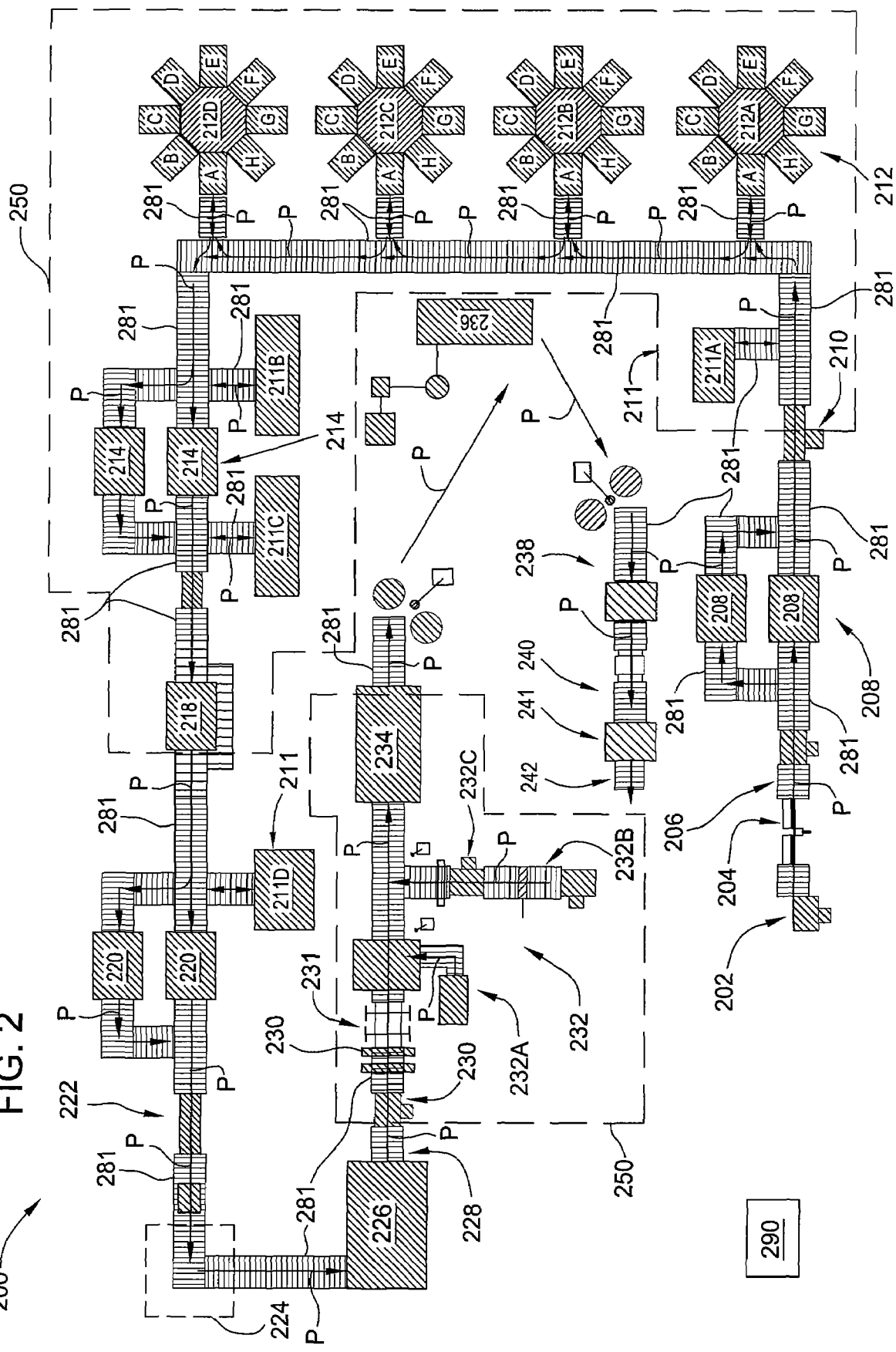
FIG. 2 illustrates a plan view of a solar cell production line according to one embodiment described herein.

FIG. 1 illustrates one embodiment of a process sequence 100 that includes a plurality of steps (i.e., steps 102-142) that are each used to form a solar cell device using a novel solar cell production line 200 described herein. The configuration, number of processing steps, and order of the processing steps in the process sequence 100 is not intended to limit the scope of the invention described herein. FIG. 2 is a plan view of one embodiment of the production line 200, which is intended to illustrate some of the typical processing modules and process flows through the system and other related aspects of the system design, and is thus not intended to limit the scope of the invention described herein.

A system controller 290 may be used to control one or more components found in the solar cell production line 200. The system controller 290 facilitates the control and automation of the overall solar cell production line 200 and typically includes a central processing unit (CPU) (not shown), memory (not shown), and support circuits (or I/O) (not shown). The CPU may be one of any form of computer processors that are used in industrial settings for controlling various system functions, substrate movement, chamber processes, and support hardware (e.g., sensors, robots, motors, lamps, etc.), and monitor the processes (e.g., substrate support temperature, power supply variables, chamber process time, I/O signals, etc.). The memory is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits are also connected to the CPU for supporting the processor in a conventional manner. The support circuits may include cache, power supplies, clock circuits, input/output circuitry, subsystems, and the like.

A program (or computer instructions) readable by the system controller 290 determines which tasks are performable on a substrate. Preferably, the program is software readable by the system controller 290 that includes code to perform tasks relating to monitoring, moving, supporting, and/or positioning of a substrate along with various process recipe tasks and various chamber process recipe steps performed in the solar cell production line 200. In one embodiment, the system controller 290 also contains a plurality of programmable logic controllers (PLC's) that are used to locally control one or more modules in the solar cell production and a material handling system controller (e.g., PLC or standard computer) that deals with the higher level strategic moving, scheduling, and running of the complete solar cell production line.

Figure 3A:
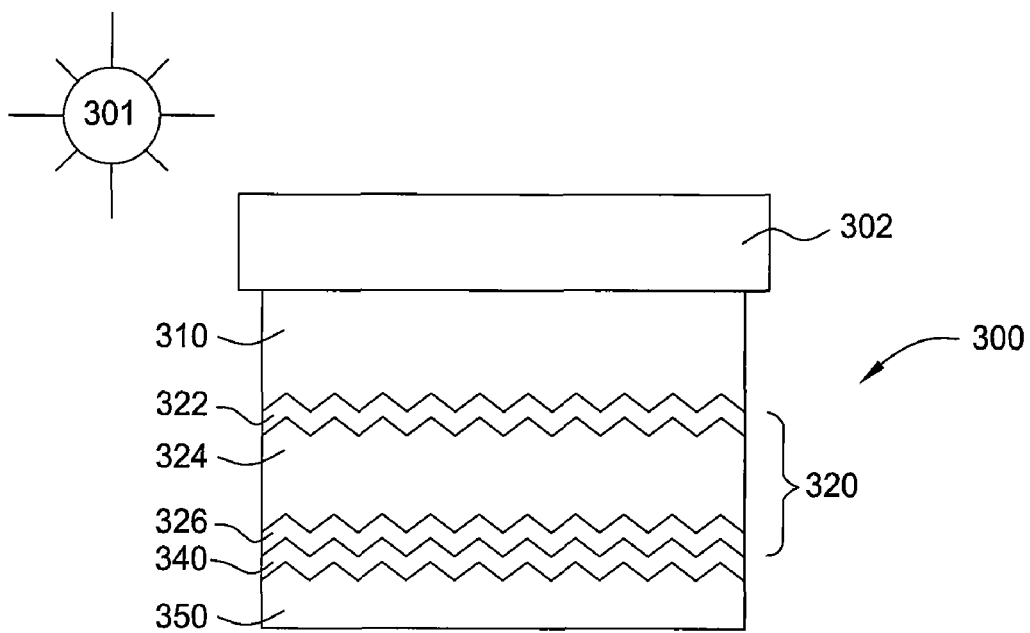
FIG. 3A is a side cross-sectional view of a thin film solar cell device according to one embodiment described herein.

Examples of a solar cell 300 that can be formed and tested using the process sequences illustrated in FIG. 1 and the components illustrated in the solar cell production line 200 are illustrated in FIGS. 3A-3E. FIG. 3A is a simplified schematic diagram of a single junction amorphous silicon solar cell 300 that can be formed and analyzed in the system described below.

As shown in FIG. 3A, the single junction amorphous silicon solar cell 300 is oriented toward a light source or solar radiation 301. The solar cell 300 generally comprises a substrate 302, such as a glass substrate, polymer substrate, metal substrate, or other suitable substrate, with thin films formed thereover. In one embodiment, the substrate 302 is a glass substrate that is about 2200 mm×2600 mm×3 mm in size. The solar cell 300 further comprises a first transparent conducting oxide (TCO) layer 310 (e.g., zinc oxide (ZnO), tin oxide (SnO)) formed over the substrate 302, a first p-i-n junction 320 formed over the first TCO layer 310, a second TCO layer 340 formed over the first p-i-n junction 320, and a back contact layer 350 formed over the second TCO layer 340. To improve light absorption by enhancing light trapping, the substrate and/or one or more of the thin films formed thereover may be optionally textured by wet, plasma, ion, and/or mechanical processes. For example, in the embodiment shown in FIG. 3A, the first TCO layer 310 is textured, and the subsequent thin films deposited thereover generally follow the topography of the surface below it.

In one configuration, the first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å. The back contact layer 350 may include, but is not limited to, a material selected from Al, Ag, Ti, Cr, Au, Cu, Pt, Ni, Mo, conductive carbon, alloys thereof, and combinations thereof.

Figure 3B:
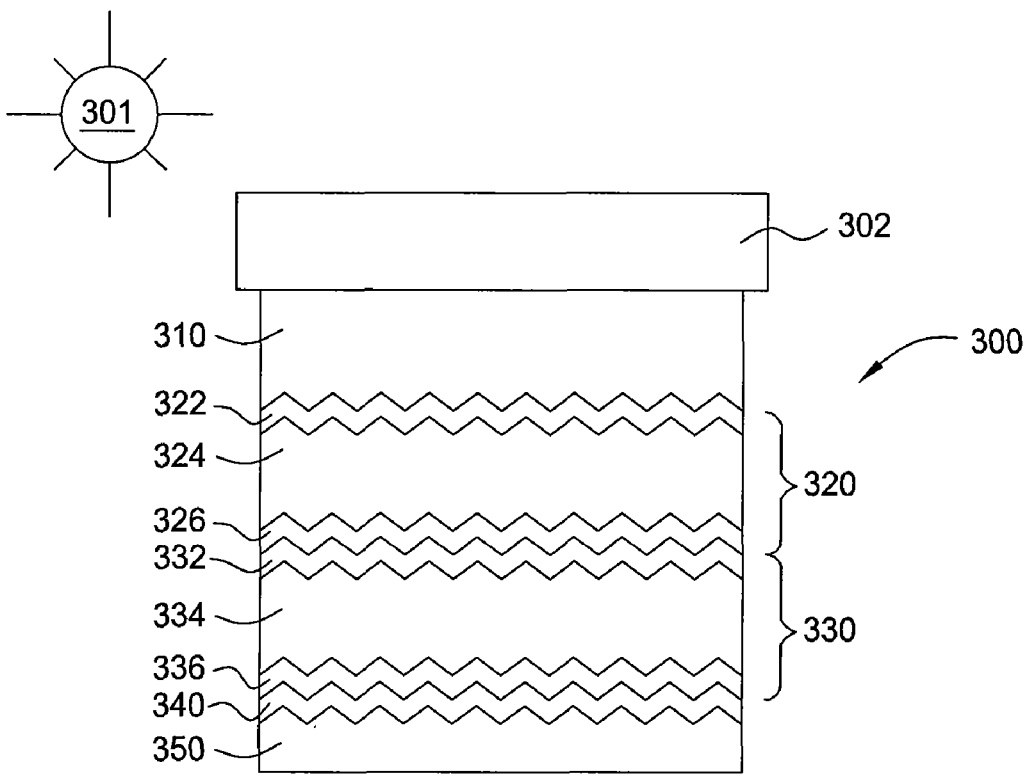
FIG. 3B is a side cross-sectional view of a thin film solar cell device according to one embodiment described herein.

FIG. 3B is a schematic diagram of an embodiment of a solar cell 300, which is a multi-junction solar cell that is oriented toward the light or solar radiation 301. The solar cell 300 comprises a substrate 302, such as a glass substrate, polymer substrate, metal substrate, or other suitable substrate, with thin films formed thereover. The solar cell 300 may further comprise a first transparent conducting oxide (TCO) layer 310 formed over the substrate 302, a first p-i-n junction 320 formed over the first TCO layer 310, a second p-i-n junction 330 formed over the first p-i-n junction 320, a second TCO layer 340 formed over the second p-i-n junction 330, and a back contact layer 350 formed over the second TCO layer 340.

In the embodiment shown in FIG. 3B, the first TCO layer 310 is textured, and the subsequent thin films deposited thereover generally follow the topography of the surface below it. The first p-i-n junction 320 may comprise a p-type amorphous silicon layer 322, an intrinsic type amorphous silicon layer 324 formed over the p-type amorphous silicon layer 322, and an n-type microcrystalline silicon layer 326 formed over the intrinsic type amorphous silicon layer 324. In one example, the p-type amorphous silicon layer 322 may be formed to a thickness between about 60 Å and about 300 Å, the intrinsic type amorphous silicon layer 324 may be formed to a thickness between about 1,500 Å and about 3,500 Å, and the n-type microcrystalline silicon layer 326 may be formed to a thickness between about 100 Å and about 400 Å.

The second p-i-n junction 330 may comprise a p-type microcrystalline silicon layer 332, an intrinsic type microcrystalline silicon layer 334 formed over the p-type microcrystalline silicon layer 332, and an n-type amorphous silicon layer 336 formed over the intrinsic type microcrystalline silicon layer 334. In one example, the p-type microcrystalline silicon layer 332 may be formed to a thickness between about 100 Å and about 400 Å, the intrinsic type microcrystalline silicon layer 334 may be formed to a thickness between about 10,000 Å and about 30,000 Å, and the n-type amorphous silicon layer 336 may be formed to a thickness between about 100 Å and about 500 Å. The back contact layer 350 may include, but is not limited to a material selected from Al, Ag, Ti, Cr, Au, Cu, Pt, Ni, Mo, conductive carbon, alloys thereof, and combinations thereof.

Figure 3C:
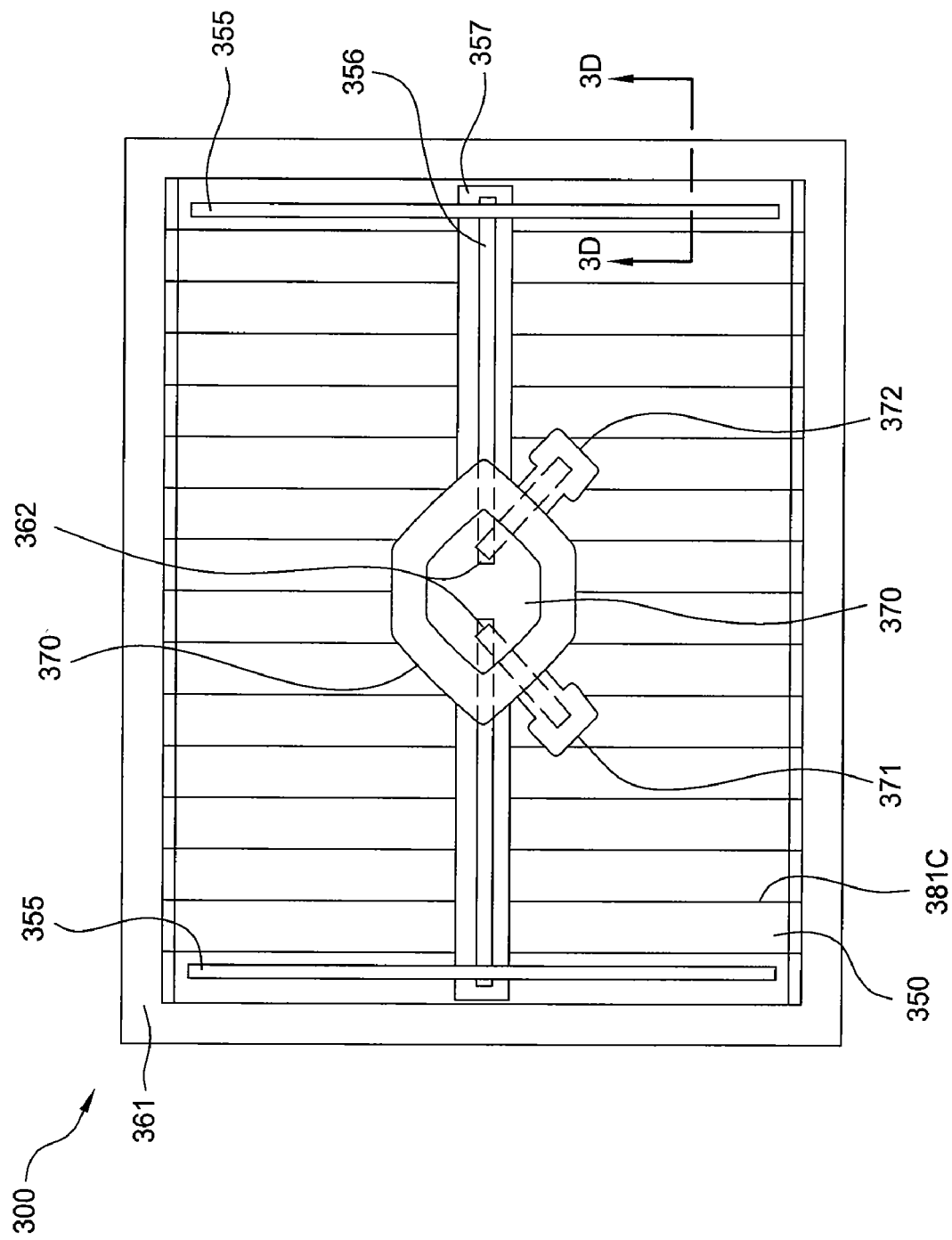
FIG. 3C is a plan view of a composite solar cell structure according to one embodiment described herein.

FIG. 3C is a plan view that schematically illustrates an example of the rear surface of a formed solar cell 300 that has been produced and tested in the production line 200. FIG. 3D is a side cross-sectional view of a portion of the solar cell 300 illustrated in FIG. 3C (see section A-A). While FIG. 3D illustrates the cross-section of a single junction cell similar to the configuration described in FIG. 3A, this is not intended to limit the scope of the invention described herein.

As shown in FIGS. 3C and 3D, the solar cell 300 may include a substrate 302, the solar cell device elements (e.g., reference numerals 310-350), one or more internal electrical connections (e.g., side-buss 355, cross-buss 356), a layer of bonding material 360, a back glass substrate 361, and a junction box 370. The junction box 370 may generally contain two junction box terminals 371, 372 that are electrically connected to leads 362 of the solar cell 300 through the side-buss 355 and the cross-buss 356, which are in electrical communication with the back contact layer 350 and active regions of the solar cell 300. To avoid confusion relating to the actions specifically performed on the substrates 302 in the discussion below, a substrate 302 having one or more of the deposited layers (e.g., reference numerals 310-350) and/or one or more internal electrical connections (e.g., side-buss 355, cross-buss 356) disposed thereon is generally referred to as a device substrate 303. Similarly, a device substrate 303 that has been bonded to a back glass substrate 361 using a bonding material 360 is referred to as a composite solar cell structure 304.

Figure 3E:
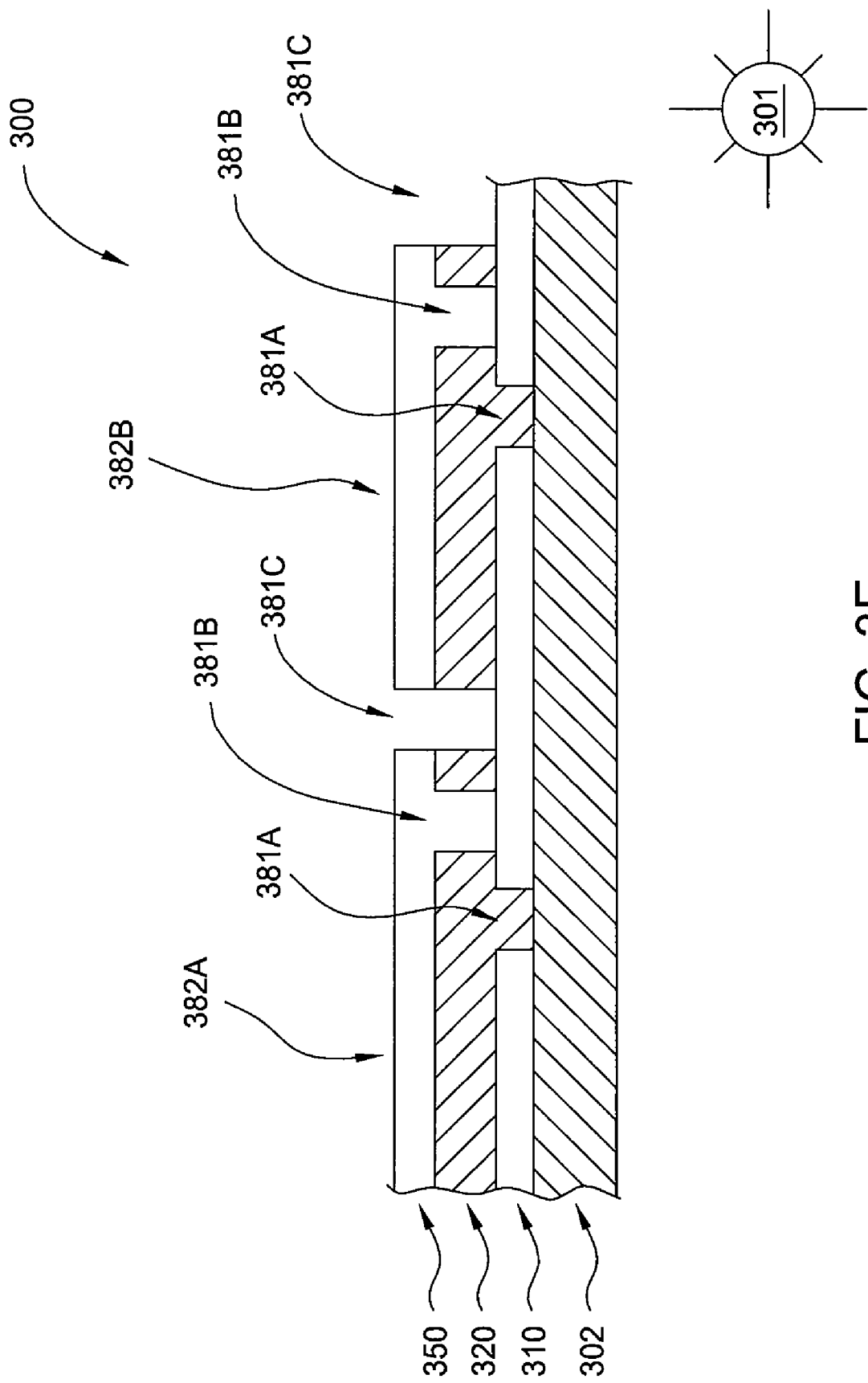
FIG. 3E is a side cross-sectional view of a thin film solar cell device according to one embodiment described herein.

FIG. 3E is a schematic cross-section of a solar cell 300 illustrating various scribed regions forming the individual cells 382A-382B within the solar cell 300. As illustrated in FIG. 3E, the solar cell 300 includes a transparent substrate 302, a first TCO layer 310, a first p-i-n junction 320, and a back contact layer 350. Three laser scribing steps may be performed to produce trenches 381A, 381B, and 381C, which are generally required to form a high efficiency solar cell device. Although formed together on the substrate 302, the individual cells 382A and 382B are isolated from each other by the insulating trench 381C formed in the back contact layer 350 and the first p-i-n junction 320. In addition, the trench 381B is formed in the first p-i-n junction 320 so that the back contact layer 350 is in electrical contact with the first TCO layer 310. In one embodiment, the insulating trench 381A is formed by the laser scribe removal of a portion of the first TCO layer 310 prior to the deposition of the first p-i-n junction 320 and the back contact layer 350. Similarly, in one embodiment, the trench 381B is formed in the first p-i-n junction 320 by the laser scribe removal of a portion of the first p-i-n junction 320 prior to the deposition of the back contact layer 350. While a single junction type solar cell is illustrated in FIG. 3E this configuration is not intended to limit the scope of the invention described herein.

General Solar Cell Formation Process Sequence

Referring to FIGS. 1 and 2, the process sequence 100 generally starts at step 102 in which a substrate 302 is loaded into a loading module 202 in the solar cell production line 200. In one embodiment, the substrates 302 are received in a "raw" state where the edges, overall size, and/or cleanliness of the substrates 302 are not well controlled. Receiving "raw" substrates 302 reduces the cost to prepare and store substrates 302 prior to forming a solar device and thus reduces the solar cell device cost, facilities costs, and production costs of the finally formed solar cell device. However, typically, it is advantageous to receive "raw" substrates 302 that have a transparent conducting oxide (TCO) layer (e.g., first TCO layer 310) already deposited on a surface of the substrate 302 before it is received into the system in step 102. If a conductive layer, such as TCO layer, is not deposited on the surface of the "raw" substrates then a front contact deposition step (step 107), which is discussed below, needs to be performed on a surface of the substrate 302.

In step 104, the surfaces of the substrate 302 or 303 are prepared to prevent yield issues later on in the process. In one embodiment of step 104, the substrate 302 or 303 is inserted into a front end substrate seaming module 204 that is used to prepare the edges of the substrate 302 or 303 to reduce the likelihood of damage, such as chipping or particle generation from occurring during the subsequent processes. Damage to the substrate 302 or 303 can affect device yield and the cost to produce a usable solar cell device. In one embodiment, the front end substrate seaming module 204 is used to round or bevel the edges of the substrate 302 or 303. In one embodiment, a diamond impregnated belt or disc is used to grind the material from the edges of the substrate 302 or 303. In another embodiment, a grinding wheel, grit blasting, or laser ablation technique is used to remove the material from the edges of the substrate 302 or 303.

Next, the substrate 302 or 303 is transported to a cleaning module 206, in which step 106, or a substrate cleaning step, is performed on the substrate 302 or 303 to remove any contaminants found on the surface of thereof. Common contaminants may include materials deposited on the substrate 302 or 303 during the substrate forming process (e.g., glass manufacturing process) and/or during shipping or storing of the substrates 302 or 303. Typically, the cleaning module 206 uses wet chemical scrubbing and rinsing steps to remove any undesirable contaminants. In one embodiment, the cleaning module 206 is available from the Energy and Environment Solutions division of Applied Materials in Santa Clara, Calif.

Referring to FIGS. 1 and 2, in one embodiment, prior to performing step 108 the substrates 302 are transported to a front end processing module (not illustrated in FIG. 2) in which a front contact formation process, or step 107, is performed on the substrate 302. In one embodiment, the front end processing module is similar to the processing module 218 discussed below. In step 107, the one or more substrate front contact formation steps may include one or more preparation, etching, and/or material deposition steps to form the front contact regions on a bare solar cell substrate 302. In one embodiment, step 107 comprises one or more PVD steps that are used to form the front contact region on a surface of the substrate 302. In one embodiment, the front contact region contains a transparent conducting oxide (TCO) layer that may contain metal element selected from zinc (Zn), aluminum (Al), indium (In), and tin (Sn). In one example, a zinc oxide (ZnO) is used to form at least a portion of the front contact layer. In one embodiment, the front end processing module is an ATON™ PVD 5.7 tool available from Applied Materials in Santa Clara, Calif. in which one or more processing steps are performed to deposit the front contact region. In another embodiment, one or more CVD steps are used to form the front contact region on a surface of the substrate 302.

Next, the device substrate 303 is transported to a scribe module 208 in which step 108, or a front contact isolation step, is performed on the device substrate 303 to electrically isolate different regions of the device substrate 303 surface from each other. In step 108, material is removed from the device substrate 303 surface by use of a material removal step, such as a laser ablation process.

In one embodiment, a Nd:vanadate (Nd:YVO$_4$) laser source is used ablate material from the device substrate 303 surface to form lines that electrically isolate one region of the device substrate 303 from the next. In one embodiment, the laser scribe process performed during step 108 uses a 1064 nm wavelength pulsed laser to pattern the material disposed on the substrate 302 to isolate each of the individual cells (e.g., reference cells 382A and 382B) that make up the solar cell 300. In one embodiment, a 5.7 m$^2$ substrate laser scribe module available from Applied Materials, Inc. of Santa Clara, Calif. is used to provide simple reliable optics and substrate motion for accurate electrical isolation of regions of the device substrate 303 surface. In another embodiment, a water jet cutting tool or diamond scribe is used to isolate the various regions on the surface of the device substrate 303.

Next, the device substrate 303 is transported to a cleaning module 210 in which step 110, or a pre-deposition substrate cleaning step, is performed on the device substrate 303 to remove any contaminants found on the surface of the device substrate 303 after performing the cell isolation step (step 108). Typically, the cleaning module 210 uses wet chemical scrubbing and rinsing steps to remove any undesirable contaminants found on the device substrate 303 surface after performing the cell isolation step.

Next, the device substrate 303 is transported to a processing module 212 in which step 112, which comprises one or more photoabsorber deposition steps, is performed on the device substrate 303. In step 112, the one or more photoabsorber deposition steps may include one or more preparation, etching, and/or material deposition steps that are used to form the various regions of the solar cell device. Step 112 generally comprises a series of sub-processing steps that are used to form one or more p-i-n junctions. In one embodiment, the one or more p-i-n junctions comprise amorphous silicon and/or microcrystalline silicon materials. In general, the one or more processing steps are performed in one or more cluster tools (e.g., cluster tools 212A-212D) in the processing module 212 to form one or more layers in the solar cell device formed on the device substrate 303. In one embodiment, the device substrate 303 is transferred to an accumulator 211A prior to being transferred to one or more of the cluster tools 212A-212D. In one embodiment, in cases where the solar cell device is formed to include multiple junctions, such as the tandem junction solar cell 300 illustrated in FIG. 3B, the cluster tool 212A in the processing module 212 is adapted to form the first p-i-n junction 320 and cluster tools 212B-212D are configured to form the second p-i-n junction 330.

In one embodiment of the process sequence 100, a cool down step, or step 113, is performed after step 112 has been performed. The cool down step is generally used to stabilize the temperature of the device substrate 303 to assure that the processing conditions seen by each device substrate 303 in the subsequent processing steps are repeatable. Generally, the temperature of the device substrate 303 exiting the processing module 212 could vary by many degrees Celsius and exceed a temperature of 50° C., which can cause variability in the subsequent processing steps and solar cell performance.

In one embodiment, the cool down step 113 is performed in one or more of the substrate supporting positions in one or more accumulators 211. In one configuration of the production line, as shown in FIG. 2, the processed device substrates 303 may be positioned in one of the accumulators 211B for a desired period of time to control the temperature of the device substrate 303. In one embodiment, the system controller 290 is used to control the positioning, timing, and movement of the device substrates 303 through the accumulator(s) 211 to control the temperature of the device substrates 303 before proceeding down stream through the production line.

Next, the device substrate 303 is transported to a scribe module 214 in which step 114, or the interconnect formation step, is performed on the device substrate 303 to electrically isolate various regions of the device substrate 303 surface from each other. In step 114, material is removed from the device substrate 303 surface by use of a material removal step, such as a laser ablation process. In one embodiment, an Nd:vanadate (Nd:YVO$_4$) laser source is used ablate material from the substrate surface to form lines that electrically isolate one solar cell from the next. In one embodiment, a 5.7 m$^2$ substrate laser scribe module available from Applied Materials, Inc. is used to perform the accurate scribing process. In one embodiment, the laser scribe process performed during step 108 uses a 532 nm wavelength pulsed laser to pattern the material disposed on the device substrate 303 to isolate the individual cells that make up the solar cell 300. As shown in FIG. 3E, in one embodiment, the trench 381B is formed in the first p-i-n junction 320 layers by use of a laser scribing process. In another embodiment, a water jet cutting tool or diamond scribe is used to isolate the various regions on the surface of the solar cell.

In one embodiment, the solar cell production line 200 has at least one accumulator 211 positioned after the scribe module(s) 214. During production accumulators 211C may be used to provide a ready supply of substrates to the processing module 218, and/or provide a collection area where substrates coming from the processing module 212 can be stored if the processing module 218 goes down or can not keep up with the throughput of the scribe module(s) 214. In one embodiment it is generally desirable to monitor and/or actively control the temperature of the substrates exiting the accumulators 211C to assure that the results of the back contact formation step 120 are repeatable.

Next, the device substrate 303 is transported to the processing module 218 in which one or more substrate back contact formation steps, or step 118, are performed on the device substrate 303. In step 118, the one or more substrate back contact formation steps may include one or more preparation, etching, and/or material deposition steps that are used to form back contact regions of the solar cell device. In one embodiment, step 118 generally comprises one or more PVD steps that are used to form the back contact layer 350 on the surface of the device substrate 303. In one embodiment, the one or more PVD steps are used to form a back contact region that contains a metal layer selected from zinc (Zn), tin (Sn), aluminum (Al), copper (Cu), silver (Ag), nickel (Ni), vanadium (V), molybdenum (Mo), and conductive carbon. In one example, a zinc oxide (ZnO) or nickel vanadium alloy (NiV) is used to form at least a portion of the back contact layer 350. In one embodiment, the one or more processing steps are performed using an ATON™ PVD 5.7 tool available from Applied Materials in Santa Clara, Calif. In another embodiment, one or more CVD steps are used to form the back contact layer 350 on the surface of the device substrate 303.

In one embodiment, the solar cell production line 200 has at least one accumulator 211 positioned after the processing module 218. During production, the accumulators 211D may be used to provide a ready supply of substrates to the scribe modules 220, and/or provide a collection area where substrates coming from the processing module 218 can be stored if the scribe modules 220 go down or can not keep up with the throughput of the processing module 218. In one embodiment it is generally desirable to monitor and/or actively control the temperature of the substrates exiting the accumulators 211D to assure that the results of the back contact formation step 120 are repeatable.

Next, the device substrate 303 is transported to a scribe module 220 in which step 120, or a back contact isolation step, is performed on the device substrate 303 to electrically isolate the plurality of solar cells contained on the substrate surface from each other. In step 120, material is removed from the substrate surface by use of a material removal step, such as a laser ablation process. In one embodiment, a Nd:vanadate (Nd:YVO$_4$) laser source is used ablate material from the device substrate 303 surface to form lines that electrically isolate one solar cell from the next. In one embodiment, a 5.7 m$^2$ substrate laser scribe module, available from Applied Materials, Inc., is used to accurately scribe the desired regions of the device substrate 303. In one embodiment, the laser scribe process performed during step 120 uses a 532 nm wavelength pulsed laser to pattern the material disposed on the device substrate 303 to isolate the individual cells that make up the solar cell 300. As shown in FIG. 3E, in one embodiment, the trench 381C is formed in the first p-i-n junction 320 and back contact layer 350 by use of a laser scribing process.

Next, the device substrate 303 is transported to a quality assurance module 222 in which step 122, or quality assurance and/or shunt removal steps, are performed on the device substrate 303 to assure that the devices formed on the substrate surface meet a desired quality standard and in some cases correct defects in the formed device. In step 122, a probing device is used to measure the quality and material properties of the formed solar cell device by use of one or more substrate contacting probes.

In one embodiment, the quality assurance module 222 projects a low level of light at the p-i-n junction(s) of the solar cell and uses the one more probes to measure the output of the cell to determine the electrical characteristics of the formed solar cell device(s). If the module detects a defect in the formed device, it can take corrective actions to fix the defects in the formed solar cells on the device substrate 303. In one embodiment, if a short or other similar defect is found, it may be desirable to create a reverse bias between regions on the substrate surface to control and or correct one or more of the defectively formed regions of the solar cell device. During the correction process the reverse bias generally delivers a voltage high enough to cause the defects in the solar cells to be corrected. In one example, if a short is found between supposedly isolated regions of the device substrate 303 the magnitude of the reverse bias may be raised to a level that causes the conductive elements in areas between the isolated regions to change phase, decompose, or become altered in some way to eliminate or reduce the magnitude of the electrical short.

Next, the device substrate 303 is optionally transported to a substrate sectioning module 224 in which a substrate sectioning step 124 is used to separate the device substrate 303 into a plurality of smaller device substrates 303 to form a plurality of smaller solar cell devices. In one embodiment of step 124, the device substrate 303 is inserted into substrate sectioning module 224 that uses a CNC glass cutting tool to accurately cut and section the device substrate 303 to form solar cell devices that are a desired size. In one embodiment, the device substrate 303 is inserted into the sectioning module 224 that uses a glass scribing tool to accurately score the surface of the device substrate 303. The device substrate 303 is then broken along the scored lines to produce the desired size and number of sections needed for the completion of the solar cell devices.

In one embodiment, steps 102-122 can be configured to use equipment that is adapted to perform process steps on large device substrates 303, such as 2200 mm×2600 mm×3 mm glass device substrates 303, and steps 124 onward can be adapted to fabricate various smaller sized solar cell devices with no additional equipment required. In another embodiment, step 124 is positioned in the process sequence 100 prior to step 122 so that the initially large device substrate 303 can be sectioned to form multiple individual solar cells that are then tested and characterized one at a time or as a group (i.e., two or more at a time). In this case, steps 102-121 are configured to use equipment that is adapted to perform process steps on large device substrates 303, such as 2200 mm×2600 mm×3 mm glass substrates, and steps 124 and 122 onward are adapted to fabricate various smaller sized modules with no additional equipment required.

Referring back to FIGS. 1 and 2, the device substrate 303 is next transported to a seamer/edge deletion module 226 in which a substrate surface and edge preparation step 126 is used to prepare various surfaces of the device substrate 303 to prevent yield issues later on in the process. In one embodiment of step 126, the device substrate 303 is inserted into seamer/edge deletion module 226 to prepare the edges of the device substrate 303 to shape and prepare the edges of the device substrate 303. Damage to the device substrate 303 edge can affect the device yield and the cost to produce a usable solar cell device. In another embodiment, the seamer/edge deletion module 226 is used to remove deposited material from the edge of the device substrate 303 (e.g., 10 mm) to provide a region that can be used to form a reliable seal between the device substrate 303 and the backside glass (i.e., steps 134-136 discussed below). Material removal from the edge of the device substrate 303 may also be useful to prevent electrical shorts in the final formed solar cell. In one embodiment, a diamond impregnated belt or disc is used to grind the material from the edges of the substrate 302 or 303. In another embodiment, wheel grinding, grit blasting, or laser ablation is used to remove the material from the edges of the substrate 302 or 303.

Next, the device substrate 303 is transported to a pre-screen module 228 in which optional pre-screen steps 128 are performed on the device substrate 303 to assure that the devices formed on the substrate surface meet a desired quality standard. In step 128, a light emitting source and probing device are used to measure the output of the formed solar cell device by use of one or more substrate contacting probes. If the module 228 detects a defect in the formed device it can take corrective actions or the solar cell can be scrapped.

Next, the device substrate 303 is transported to a cleaning module 230 in which step 130, or a pre-lamination substrate cleaning step, is performed on the device substrate 303 to remove any contaminants found on the surface of the substrates 303 after performing steps 122-128. Typically, the cleaning module 230 uses wet chemical scrubbing and rinsing steps to remove any undesirable contaminants found on the substrate surface after performing the cell isolation step.

Next, the substrate 303 is transported to a bonding wire attach module 231 in which a bonding wire attach step 131 is performed on the substrate 303. Step 131 is used to attach the various wires/leads required to connect various external electrical components to the formed solar cell 300. The bonding wire attach module 231 is an automated wire bonding tool that reliably and quickly forms the numerous interconnects required to produce large solar cells 300 in the production line 200.

In one embodiment, the bonding wire attach module 231 is used to form the side-buss 355 (FIG. 3C) and cross-buss 356 on the back contact layer 350 of the device substrate 303. In this configuration, the side-buss 355 may comprise a conductive material that is bonded to the back contact layer 350 to form a robust electrical contact. In one embodiment, the side-buss 355 and cross-buss 356 each comprise a metal strip, such as copper tape, a nickel coated silver ribbon, a silver coated nickel ribbon, a tin coated copper ribbon, a nickel coated copper ribbon, or other conductive material that can carry current delivered by the solar cell 300 and that can be reliably bonded to the back contact layer 350. In one embodiment, the metal strip is between about 2 mm and about 10 mm wide and between about 1 mm and about 3 mm thick.

In one embodiment, electrically conductive adhesive is applied to the back contact layer 350 of the device substrate 303. The side-buss 355 is then accurately placed on the electrically conductive adhesive via the bonding wire attach module 231. The electrically conductive adhesive is subsequently cured under pressure, such as during step 136, in order to provide significantly increased conductivity between the back contact layer 350 and the side-buss 355.

In one embodiment, the cross-buss 356, which is electrically connected to the side-buss 355 at junctions, is electrically isolated from the back contact layer 350 of the solar cell 300 by use of an insulating material 357, such as an insulating tape. The ends of each of the cross-busses 356 generally have one or more leads 362 that are used to connect the side-buss 355 and the cross-buss 356 to the electrical connections found in a junction box 370, which is used to connect the formed solar cell 300 to other external electrical components. A more detailed description of an exemplary bonding wire attach module 231 and exemplary processes performed in the bonding wire attach step 131 are presented below in the section entitled, "Bonding Wire Attach Module."

In step 132, a bonding material 360 (FIG. 3D) and "back glass" substrate 361 are prepared for delivery into the solar cell formation process (i.e., process sequence 100). The preparation process is performed in the glass lay-up module 232, which comprises a material preparation module 232A, a glass loading module 232B, and a glass cleaning module 232C. The back glass substrate 361 is bonded onto the device substrate 303 formed in steps 102-130 above by use of a laminating process (step 134 discussed below). In one embodiment of step 132, a polymeric material is prepared to be placed between the back glass substrate 361 and the deposited layers on the device substrate 303 to form a hermetic seal to prevent the environment from attacking the solar cell during its life.

Referring to FIG. 2, step 132 comprises a series of sub-steps in which a bonding material 360 is prepared in the material preparation module 232A, the bonding material 360 is then placed over the device substrate 303, the back glass substrate 361 is loaded into the loading module 232B and washed by the cleaning module 232C, and the back glass substrate 361 is then placed over the bonding material 360 and the device substrate 303.

In one embodiment, the material preparation module 232A is adapted to receive the bonding material 360 in a sheet form and perform one or more cutting operations to provide a bonding material, such as Polyvinyl Butyral (PVB) or Ethylene Vinyl Acetate (EVA) sized to form a reliable seal between the backside glass and the solar cells formed on the device substrate 303. In general, when using bonding materials 360 that are polymeric, it is desirable to control the temperature (e.g., 16-18° C.) and relative humidity (e.g., RH 20-22%) of the solar cell production line 200 where the bonding material 360 is stored and integrated into the solar cell device to assure that the attributes of the bond formed in the bonding module 234 are repeatable and the dimensions of the polymeric material are stable. It is generally desirable to store the bonding material prior to use in temperature and humidity controlled area (e.g., T=6-8° C.; RH=20-22%).

In one part of step 132, the bonding material 360 is transported and positioned over the back contact layer 350, the side-buss 355 (FIG. 3C), and the cross-buss 356 (FIG. 3C) elements of the device substrate 303 using an automated robotic device. The device substrate 303 and bonding material 360 are then positioned to receive a back glass substrate 361, which can be placed thereon by use of the same automated robotic device used to position the bonding material 360, or a second automated robotic device.

In one embodiment, prior to positioning the back glass substrate 361 over the bonding material 360, one or more preparation steps are performed to the back glass substrate 361 to assure that subsequent sealing processes and final solar product are desirably formed. In one case, the back glass substrate 361 is received in a "raw" state where the edges, overall size, and/or cleanliness of the substrate 361 are not well controlled. Receiving "raw" substrates reduces the cost to prepare and store substrates prior to forming a solar device and thus reduces the solar cell device cost, facilities costs, and production costs of the finally formed solar cell device. In one embodiment of step 132, the back glass substrate 361 surfaces and edges are prepared in a seaming module (e.g., front end substrate seaming module 204) prior to performing the back glass substrate cleaning step. In the next sub-step of step 132, the back glass substrate 361 is transported to the cleaning module 232C in which a substrate cleaning step is performed on the substrate 361 to remove any contaminants found on the surface of the substrate 361. Typically, the cleaning module 232C uses wet chemical scrubbing and rinsing steps to remove any undesirable contaminants as discussed above. The prepared back glass substrate 361 is then positioned over the bonding material and the device substrate 303 by use of an automated robotic device.

Next, the device substrate 303, the back glass substrate 361, and the bonding material 360 are transported to a bonding module 234 in which lamination step 134 is performed to bond the backside glass substrate 361 to the device substrate formed in steps 102-130 discussed above. In step 134, a bonding material 360, such as Polyvinyl Butyral (PVB) or Ethylene Vinyl Acetate (EVA), is sandwiched between the backside glass substrate 361 and the device substrate 303. Heat and pressure are applied to the structure to form a bonded and sealed device using various heating elements and other devices found in the bonding module 234. The device substrate 303, the back glass substrate 361, and the bonding material 360 thus form a composite solar cell structure 304 (FIG. 3D) that at least partially encapsulates the active regions of the solar cell device. In one embodiment, at least one hole formed in the back glass substrate 361 remains at least partially uncovered by the bonding material 360 to allow portions of the cross-buss 356 or the side-buss 355 to remain exposed so that electrical connections can be made to these regions of the solar cell structure 304 in future steps (i.e., step 138). A more detailed description of an exemplary bonding module 234 and exemplary processes performed in the lamination step 136 are presented below in the section entitled, "Bonding Module."

Next, the composite solar cell structure 304 is transported to an autoclave module 236 in which autoclave step 136 is performed on the composite solar cell structure 304 to remove trapped gasses in the bonded structure, to assure that a good bond is formed during step 134, and to cure the electrically conductive adhesive applied during step 131, such that greater conductivity between the back contact layer 350 and the side-buss 355 is achieved. In step 134, a bonded solar cell structure 304 is inserted in the processing region of the autoclave module where heat and high pressure gases are delivered to reduce the amount of trapped gas improve the properties of the bond between the device substrate 303, back glass substrate 361, and bonding material 360. The heat and high pressure processes in step 134 are also used to cure the electrically conductive adhesive to provide a good electrical connection between the back contact layer 350 and the side-buss 355, such as a conductivity approximately equivalent to that of a soldered connection. Additionally, the processes performed in the autoclave are useful to assure that the stress in the glass and bonding layer (e.g., PVB layer) are more controlled to prevent future failures of the hermetic seal or failure of the glass due to the stress induced during the bonding/lamination process. In one embodiment, it may be desirable to heat the device substrate 303, back glass substrate 361, and bonding material 360 to a temperature that causes stress relaxation in one or more of the components in the formed solar cell structure 304. A more detailed description of an exemplary autoclave module 236 and exemplary processes performed in the autoclave step 136 are presented below in the section entitled, "Autoclave Module."

Next, the solar cell structure 304 is transported to a junction box attachment module 238 in which junction box attachment steps 138 are performed on the composite solar cell structure 304. The junction box attachment module 238, used during step 138, is used to install a junction box 370 (FIG. 3C) on a partially formed solar cell. The installed junction box 370 acts as an interface between the external electrical components that will connect to the formed solar cell, such as other solar cells or a power grid, and the internal electrical connections points, such as the leads 362, formed during step 131. In one embodiment, the junction box 370 contains one or more junction box terminals 371, 372 so that the formed solar cell can be easily and systematically connected to other external devices to deliver the generated electrical power.

Next, the solar cell structure 304 is transported to the device testing module 240 in which device screening and analysis steps 140 are performed on the solar cell structure 304 to assure that the devices formed on the solar cell structure 304 surface meet desired quality standards. In one embodiment, the device testing module 240 is a solar simulator module that is used to qualify and test the output of the one or more formed solar cells. In step 140, a light emitting source and probing device are used to measure the output of the formed solar cell device by use of one or more automated components adapted to make electrical contact with terminals in the junction box 370. If the module detects a defect in the formed device it can take corrective actions or the solar cell can be scrapped.

Next the solar cell structure 304 is transported to the support structure module 241 in which support structure mounting steps 141 are performed on the solar cell structure 304 to provide a complete solar cell device that has one or more mounting elements attached to the solar cell structure 304 formed using steps 102-140 to a complete solar cell device that can easily be mounted and rapidly installed at a customer's site.

Next, the solar cell structure 304 is transported to the unload module 242 in which step 142, or device unload steps are performed on the substrate to remove the formed solar cells from the solar cell production line 200.

In one embodiment of the solar cell production line 200, one or more regions in the production line are positioned in a clean room environment to reduce or prevent contamination from affecting the solar cell device yield and useable lifetime. In one embodiment, as shown in FIG. 2, a class 10,000 clean room space 250 is placed around the modules used to perform steps 108-118 and steps 130-134.

Bonding Wire Attach Module

As noted above, during the bonding wire attach step 131, one or more process steps are performed to form the electrical leads 362 (FIG. 3C) that will allow the fully formed solar cell 300 to be easily and systematically connected to external devices for delivering solar generated electrical power.

Figure 4A:
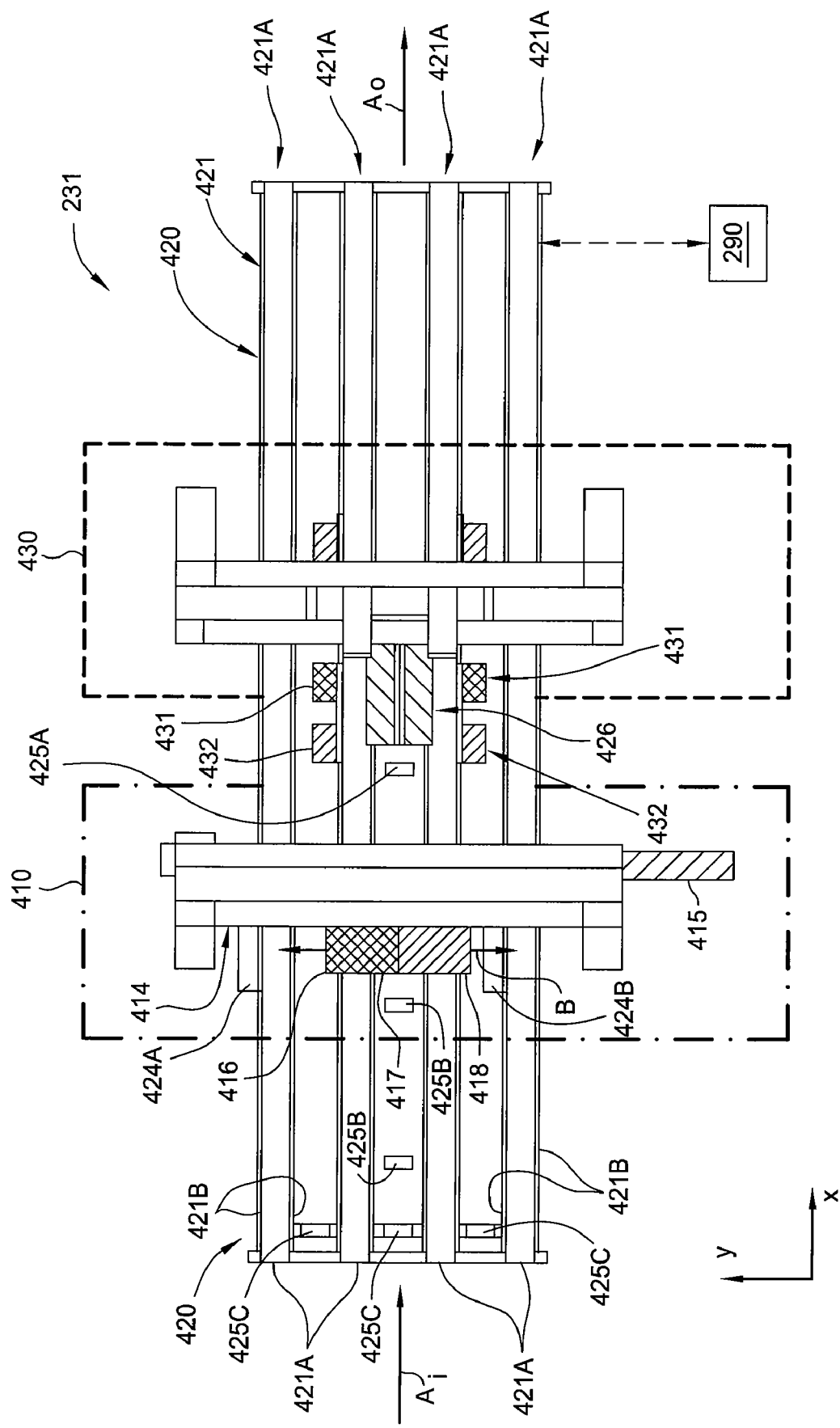
FIG. 4A is a schematic plan view of a bonding wire attach module according to one embodiment of the present invention.

FIGS. 4A-4B illustrate one embodiment of the bonding wire attach module 231 for performing the process steps that make up the bonding wire attach step 131. FIG. 4A is a schematic plan view of the bonding wire attach module 231 according to one embodiment of the present invention. In one embodiment, the bonding wire attach module 231 includes a substrate handling system 420, a cross-buss assembly 410, and a side-buss assembly 430 controlled by the system controller 290.

In general operation, a device substrate 303 is transferred into the bonding wire attach module 231 following the path $A_i$. The device substrate 303 then passes through the cross-buss assembly 410 and the side-buss assembly 430 via the substrate handling system 420. The device substrate 303 then exits the bonding wire attach module 231 following path $A_o$.

In one embodiment, the substrate handling system 420 includes a support truss, or support structure (not shown), that is positioned beneath and is adapted to support and retain the various components used in the bonding wire attach module 231. In one embodiment, the substrate handling system 420 includes a conveyor system 421 that has a plurality of conventional automated conveyor belts 421A for positioning and transferring the device substrate 303 within the bonding wire attach module 231 in a controlled and automated fashion.

In one embodiment, the conveyor system 421 also includes a plurality of frictionless support elements 421B that are mounted to the support structure and positioned adjacent to the automated conveyor belts 421A to allow a device substrate 303 to be supported, moved, and positioned with minimum contact and abrasion of the device substrate surfaces during device substrate alignment and/or the bonding processes. In one embodiment, the conventional automated conveyor belts 421A are mounted on a moveable structure that allows the device substrate 303 to be disposed on and/or removed from the frictionless support elements 421B by the movement of the automated conveyor belts 421A. The frictionless support elements 421B may comprise a gas receiving plenum that has one or more plenum surfaces that have a plurality of holes formed therein.

In operation, the holes are adapted to deliver a gas (e.g., air, $N_2$) from the gas receiving plenum to a surface of the device substrate 303 that is disposed over the plenum surface. The gas delivered by the holes is thus used to "frictionlessly" support the device substrate 303 over the plenum surface so that the device substrate 303 can be moved and aligned without contacting or abrading the surface of the device substrate 303. The use of the frictionless support elements 421B also allows for a more precise control of the movement of the device substrate 303 versus just using the conveyor system 421 since the often small X-direction and Y-direction movements of a large device substrate 303 during alignment are sensitive to frictional forces resisting the alignment.

In one embodiment, the substrate handling system 420 also includes various aligning and gripping members for aligning, positioning, and/or moving the device substrate 303 within the bonding wire attach module 231. In one embodiment, the substrate handling system 420 includes a leading edge rough stop 425A, one or more trailing edge rough stops 425B, and one or more gripping elements 425C for retaining and moving the device substrate 303 during processing. In one embodiment, the leading edge rough stop 425A, the one or more trailing edge rough stops 425B, and the one or more gripping elements 425C are each moveable in a vertical (Z-direction) and X-Y directions (FIG. 4A) to actively position and angularly align the retained device substrate 303 during processing.

In one embodiment, various configurations of leading edge rough stops 425A and trailing edge rough stops 425B are used to position each size of device substrate 303 that is processed in the bonding wire attach module 231. That is, a size appropriate trailing edge stop 425B may be used in conjunction with a leading edge rough stop 425A as each different sized device substrate 303 is processed by the bonding wire attach module 231. For example, one trailing edge stop 425B may be appropriate for a full sized device substrate, such as 2200 mm×2600 mm×3 mm, and another trailing edge stop 425 B may be appropriate for a quarter sized panel, such as 1100 mm×1300×3 mm.

In one embodiment, the substrate handling system 420 also includes one or more datum finding elements, such as one or more Y-axis datum elements 424A and pusher elements 424B for aligning an edge of the device substrate 303 to a known position within the bonding wire attach module 231. In operation, after the leading edge of the device substrate 303 has been located by a physical stop and/or one or more sensors contained in the leading edge rough stops 425A, the device substrate 303 is pressed against the Y-axis datum elements 424A by the pusher elements 424B to align the device substrate 303 to a known Y position within the bonding wire attach module 231.

In one embodiment, the substrate handling system 420 also includes a vision system 426 for accurately aligning active regions of the device substrate 303 to elements in the cross-buss assembly 410 and the side-buss assembly 430 so that the cross-buss 356 (FIG. 3C) and the side-buss 355 can be accurately positioned on the device substrate 303. In one embodiment, the vision system 426 and the system controller 290 are adapted to locate one or more features on the device substrate 303 by scanning the device substrate with the vision system 426. In one embodiment, the vision system 426 includes at least one camera as well as other electronic components for locating, storing, and communicating the position of features on the device substrate 303.

For example, the vision system 426 can be used to locate various scribed features (e.g., laser scribe in steps 108, 114, and 120) formed in the layers deposited on the device substrate 303. Due to tolerances in the device substrate 303 received in step 102, the position of the scribed features can vary relative to the edges of the device substrate 303. Such variability can affect the placement of the cross-buss 356 and side-buss 355 as well as the overall device yield of the solar cell formation process 100. Once the desirable scribed features on the device substrate 303 are located by the vision system 426, the device substrate 303 can be repositioned by use of the substrate handling system 420 to allow the cross-buss 356 and the side-buss 355 to be placed in a desired position relative to the scribed features.

Still referring to FIG. 4A, the cross-buss assembly 410 is generally used to deposit the cross-buss 356 and insulating material 357 (FIG. 3C) on the back contact layer 350 of the device substrate 303. In one embodiment, the cross-buss assembly 410 includes a motion assembly 414, a material feed assembly 416, and a cross-buss feed assembly 415. The motion assembly 414 is used to position the dispensing assembly 417 in a cross direction "B" (i.e., ±Y-direction) so that the cross-buss 356 can be deposited on the surface of the back contact layer 350.

In one embodiment, the motion assembly 414 includes a conventional actuator that is used to control the movement of the material feed assembly 416 by use of commands sent from the system controller 290. To prevent the cross-buss 356 elements from shorting the active regions of the solar cell 300 the insulating material 357, which has electrical insulating properties, is placed under the cross-buss 356.

In one embodiment, an insulating material dispensing assembly 417 receives insulating material from the material feed assembly 416 and dispenses the insulating material onto the back contact layer 350 of the device substrate 303. In one embodiment, a cross-buss dispensing assembly 418 receives the cross-buss 356 from the cross-buss feed assembly 415 and dispenses the cross-buss onto the insulating material. In one embodiment, the insulating material 357 has an adhesive material deposited on two sides so that one side can be affixed to the surface of the device substrate 303 by use of one or more application elements, such as a roller, and the cross-buss 356 can be affixed to the other side of the insulating material 357 by use of the application element(s). In another embodiment, the insulating material 357 has an adhesive material deposited on only one side so that it can be affixed to the surface of the device substrate via the application element(s), and the cross-buss 356 has an adhesive material deposited on one side so that it can be bonded to the insulating material 357 surface via the application element(s). In one embodiment, the side of the insulating material 357 having the adhesive is protected prior to application via a protective strip, which is removed as the insulating material 357 is dispensed onto the back contact layer 350 of the device substrate 303.

In one embodiment, the side-buss assembly 430 has two adhesive dispensing modules 432 and two side-buss depositing elements 431 that are used to substantially simultaneously dispose the two side-busses 355 (FIG. 3C) on the device substrate 303 as the device substrate 303 is moved in the direction "A$_i$" through the bonding wire attach module 231. In operation, each adhesive dispensing module 432 is used to dispense a desired amount of an electrically conductive adhesive material on desired regions of the back contact layer 350.

Next, the side-buss depositing elements 431 substantially simultaneously deposit a side-buss 355 on opposing edges of the device substrate 303 over a portion of the dispensed conductive adhesive material. In one embodiment, the side-buss depositing elements 431 are adapted to apply a pretension to the side-buss 355 just prior to placing the side-buss 355 onto the conductive adhesive. In general, it is desirable for the conductive adhesive to have adhesive properties that enable it to retain the side-buss 355 in a desired position on the device substrate 303, even before it is fully cured.

FIG. 4B is a side view of a portion of one of the adhesive dispensing modules 432 and side-buss depositing element 431 that illustrates elements used to place the side-buss 355 onto the back contact layer 350 of the device substrate 303 as the device substrate 303 is sequentially indexed, or continually moved, in the direction "A$_i$" according to one embodiment of the present invention. In operation, a desired pattern of conductive adhesive is deposited onto the back contact layer 350 of the device substrate 303 as the device substrate 303 is advanced.

Figure 5:
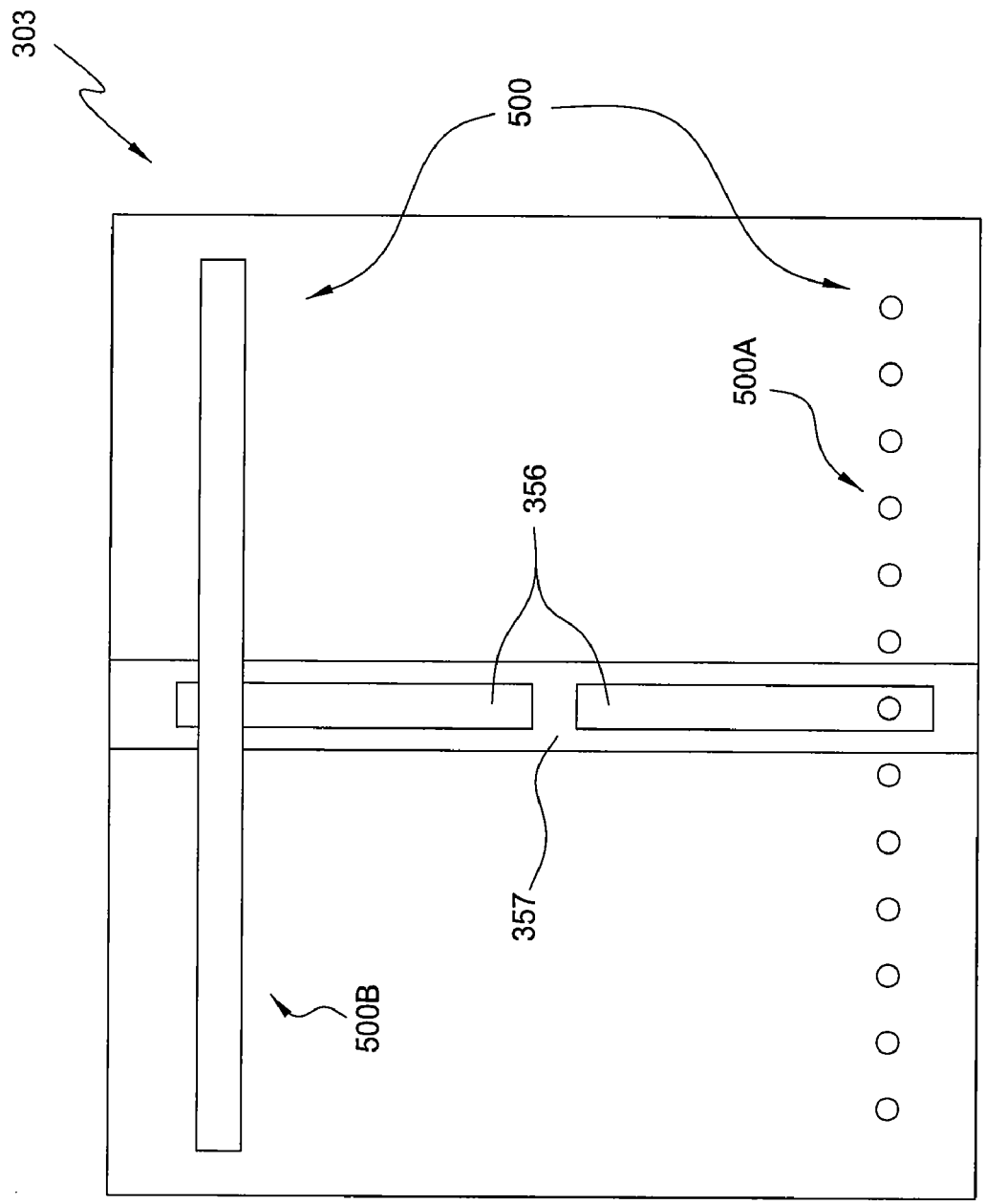
FIG. 5 is a plan view of a device substrate having exemplary patterns of conductive adhesive deposited thereon.

FIG. 5 is a plan view of a device substrate 303 having exemplary patterns of conductive adhesive deposited thereon. In one embodiment, a conductive adhesive pattern 500 comprises a continuous line of adhesive along the desired region of the device substrate 303 as depicted in FIG. 5 as conductive adhesive pattern 500B. In another embodiment, the conductive adhesive pattern 500 comprises a plurality of individual adhesive beads spaced along a continuous line as depicted in FIG. 5 as conductive adhesive pattern 500A. In one embodiment, the conductive adhesive pattern 500 may be deposited in individual beads at increments from about 10 mm to about 50 mm apart, such as about 30 mm apart. In one embodiment, the individual beads are circular in shape and have a diameter that is similarly sized at about the width of the metal strips used to form the side-buss 355, such as between about 2 mm and about 10 mm wide.

In general, the electrically conductive adhesive is a polymeric material having conductive particles disposed therein. In one embodiment, the electrically conductive adhesive is an epoxy material having conductive particles disposed therein. The electrically conductive adhesive may also be an acrylic adhesive, polyurethane adhesive, rubber adhesive, silicone adhesive, or other similar adhesive. In one embodiment, the conductive particles comprise a percentage density of the conductive adhesive between about 40% and about 80%, such as about 60%. In one embodiment, the conductive particles are nanoparticles having an approximate diameter between about 1 nm and about 100 nm. In one embodiment, the conductive particles may comprise materials selected from silver, gold, tin, copper, nickel, lead, carbon, graphite, diamond-like-carbon, alloys thereof, derivatives thereof, and combinations thereof.

Next, referring to FIG. 4B, a length of the side-buss 355 is positioned onto the pattern of conductive adhesive 490 by use of one or more feed grippers 435 and one or more rollers 436 as the device substrate 303 advances in the direction "A$_i$" according to one embodiment. In one embodiment, the feed gripper 435 and roller 436 are configured to place the side-buss 355 in tension as it is applied to the conductive adhesive 490. In one embodiment, the roller 436 applies a slight downward force onto the side-buss 355 as it is positioned in order to temporarily secure the side-buss 355 by breaking the surface tension of the conductive adhesive such that the side-buss 355 will remain in position until the conductive adhesive is cured in subsequent steps (i.e., step 136). In one embodiment, strips of a nonconductive adhesive tape (not shown) are applied at desired intervals across the side-buss 355 and surface of the back contact layer 350 in order to temporarily secure the side-buss 355 in position until the conductive adhesive is cured in subsequent steps (i.e., step 136).

In one embodiment, the conductive adhesive is curable at room temperature within a specified time. For instance, the conductive adhesive may cure at room temperature within a time period between about 40 hours and about 60 hours. However, as discussed below, it may be desirable to cure the conductive adhesive under pressure to increase the conductivity of the adhesive over that of conductive adhesive cured at atmospheric pressure. Therefore, in one embodiment, to ensure that the conductive adhesive does not cure prior to the accelerated curing process under pressure, the system controller 290 is configured to monitor and control the timing of the flow of device substrates between step 131 and step 136.

Bonding Module

As noted above, during the lamination step 134, one or more process steps are performed to bond the backside glass substrate 361 to the device substrates 303 formed in steps 102-132 to form a bonded composite solar cell structure 304 (FIG. 3D). The lamination step 134 is thus used to seal the active elements of the fully formed solar cell 300 from the external environment to prevent premature degradation during its useable life.

Figure 6:
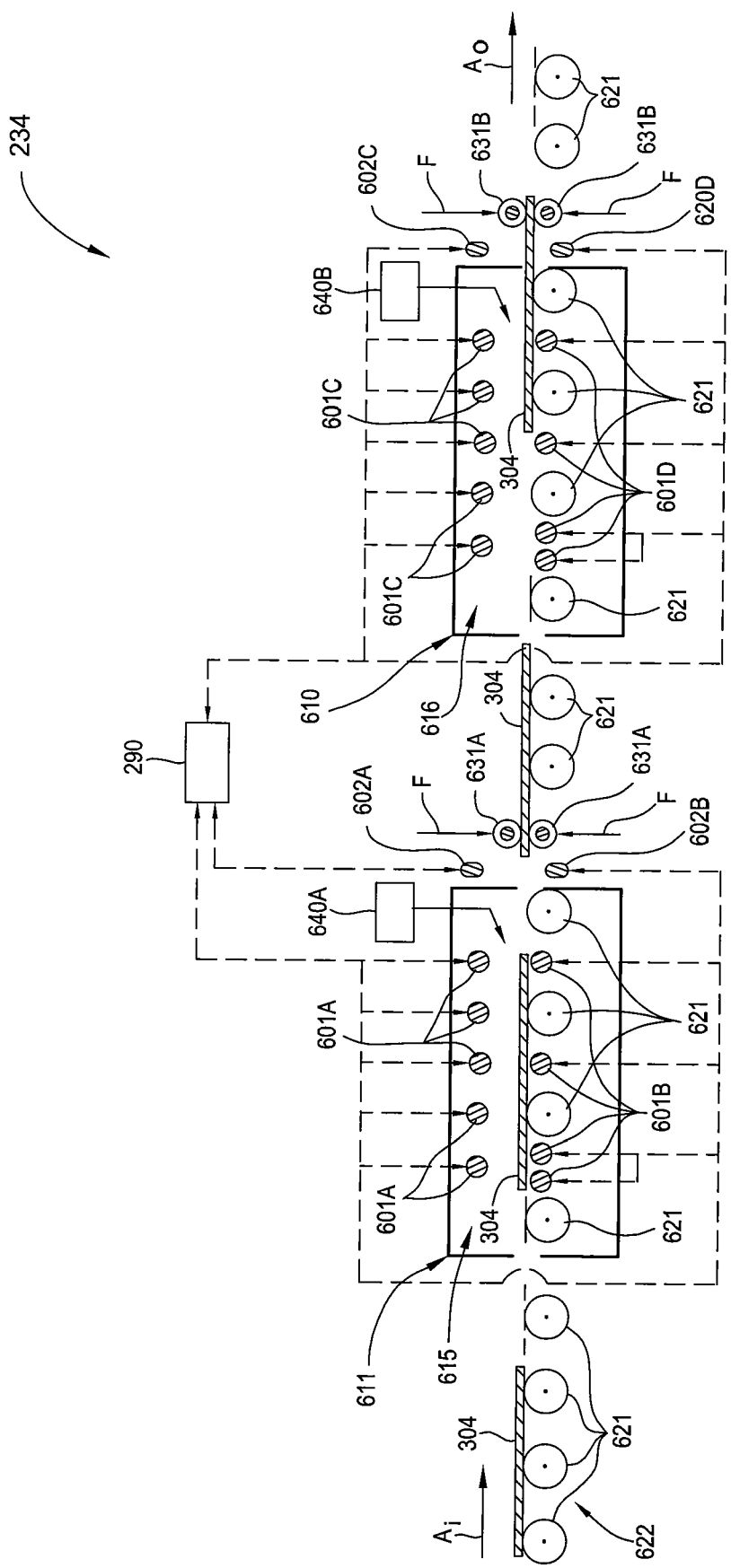
FIG. 6 is a schematic cross-sectional view of a bonding module according to one embodiment.

FIG. 6 illustrates an embodiment of a bonding module 234 which may be used to perform lamination process discussed below. FIG. 6 is a schematic cross-sectional view of the bonding module 234 according to one embodiment. Generally, the bonding module 234 includes a preheat module 611, a lamination module 610, and a conveyor system 622, all controlled by the system controller 290. The conveyor system 622 generally includes a plurality of support rollers 621 that are designed to support, move, and/or position the device substrate 303 including the uncured electrically conductive adhesive material disposed between the back contact layer 350 and the side-busses 355, the bonding material 360 disposed over the device substrate 303, and the back glass substrate 361 disposed over the bonding material (collectively referred to hereafter as a composite solar cell structure 304). As shown in FIG. 6, the composite solar cell structure 304 can be transferred into and through the bonding module 234 following the paths $A_I$ and $A_O$.

The preheat module 611 generally contains a plurality of support rollers 621, a plurality of heating elements 601A and 601B, two or more temperature sensors (e.g., temperature sensors 602A and 602B), and one or more compression rollers 631A. The plurality of support rollers 621 are adapted to support the composite solar cell structure 304 while it is positioned within the processing region 615 of the preheat module 611 and are configured to withstand the temperatures created by the heating elements 601A and 601B during normal processing. In one embodiment, the preheat module 611 also contains a fluid delivery system 640A that is use to deliver a desired flow of a fluid, such as air or nitrogen ($N_2$), through the processing region 615 during processing.

The plurality of heating elements 601A and 601B are typically lamps (e.g., IR lamps), resistive heating elements, or other heat generating devices that are controlled by the system controller 290 to deliver a desired amount of heat to desired regions of the composite solar cell structure 304 during processing. In one embodiment, a plurality of heating elements 601A are positioned above the composite solar cell structure 304 and a plurality of heating elements 601B are positioned below the composite solar cell structure 304. In one embodiment, the heating elements 601A and 601B are oriented substantially perpendicular to the direction of travel of the substrate and the energy delivered by the lamps creates a uniform temperature profile across the substrate as it is continually moved through the processing region 615.

The compression rollers 631A are adapted to provide a desired amount of force "F" to the composite solar cell structure 304 to assure that all of the air bubbles found within the composite solar cell structure 304 are removed and the bonding material within the composite solar cell structure 304 is evenly distributed after performing the preheat process step. The compression rollers 631A are generally configured to receive the composite solar cell structure 304 after it has been sufficiently heated in the preheat module 611.

Referring to FIG. 6, the preheat module 611 also contains two temperatures sensors 602A and 602B that are adapted to measure the temperature of regions of the composite solar cell structure 304 during the preheat process. The temperature sensors may each be a non-contact type temperature sensor, such as a conventional pyrometer, or a conventional contacting type of temperature sensor. In one embodiment, the preheat module 611 contains a top temperature sensor 602A that is adapted to measure the temperature of the top of the composite solar cell structure 304 and a bottom temperature sensor 602B that is adapted to measure the temperature of the bottom of the composite solar cell structure 304 during or after processing. In one embodiment, the top temperature sensor 602A and a bottom temperature sensor 602B are positioned over one another so that the difference in temperature between the top side and bottom side of the composite solar cell structure 304 at the same position on the substrate can be simultaneously measured. In one example, in which the bonding material is PVB, the preheat module temperature set point may be in a range between about 40° C. and about 60° C.

In general, during the preheat process, the composite solar cell structure 304 is controllably heated as it passes through the processing region 615 by use of the one more of the heating elements 601A and 601B disposed therein. In one embodiment, at least one of the top heating elements 601A and at least one of the bottom heating elements 601B are close loop controlled using the system controller 290 and at least one temperature sensor 602B positioned on the top of the composite solar cell structure 304 and at least one temperature sensor 602B positioned on the bottom of the composite solar cell structure 304. After the composite solar cell structure 304 is preheated, a desired force is applied to one or more sides of the preheated composite solar cell structure 304 by use of the one or more compression rollers 631A using one or more controlled force generating elements. The applied force supplied by the one or more compression rollers 631A may be between about 200 N/cm and about 600 N/cm.

The lamination module 610 generally contains a plurality of support rollers 621, a plurality of heating elements 601C and 601D, two or more temperature sensors (e.g., temperature sensors 602C and 602D), and one or more compression rollers 631B. The plurality of support rollers 621 are adapted to support the composite solar cell structure 304 while it is positioned within the processing region 616 of the lamination module 610 and are configured to withstand the temperatures achieved during normal thermal processing. In one embodiment, the lamination module 610 also contains a fluid delivery system 640B that is use to deliver a desired flow of a fluid through the processing region 616 during processing. In one embodiment, the fluid delivery system 640B is fan assembly that is adapted to deliver a desired flow of air across one or more surfaces of the substrate disposed within the processing region 616 by use of commends sent from the system controller 290.

The plurality of heating elements 601C and 601D are typically lamps (e.g., IR lamps), resistive heating elements, or other heat generating devices that are controlled by the system controller 290 to deliver a desired amount of heat to desired regions of the composite solar cell structure 304 during processing. In one embodiment, a plurality of heating elements 601C are positioned above the composite solar cell structure 304 and a plurality of heating elements 601D are positioned below the composite solar cell structure 304. In one embodiment, the heating elements 601C, 601D are oriented substantially perpendicular to the direction of travel of the substrate and the energy delivered by the lamps creates a uniform temperature profile across the substrate as it is moved through the processing region.

The one or more compression rollers 631B are adapted to provide a desired amount of force "F" to the composite solar cell structure 304 (i.e., composite structure) to assure that all of the air bubbles found within the composite solar cell structure 304 are removed and the bonding material within the composite solar cell structure 304 is evenly distributed. The compression rollers 631B are generally configured to receive the composite solar cell structure 304 after it has been sufficiently heated in the lamination module 610. In one embodiment, as shown in FIG. 6, a pair of compression rollers 631B is used to remove any trapped air from the substrate by applying a force "F" to both sides of the composite solar cell structure 304 by the compression rollers 631B by use of a conventional electric or pneumatic force generating element.

Referring to FIG. 6, the lamination module 610 also contains two temperatures sensors 602C, 602D that are adapted to measure the temperature of regions of the composite solar cell structure 304 during the lamination process. The temperature sensors may be non-contact type temperature sensor, such as a conventional pyrometer, or a conventional contact type temperature sensor. In one embodiment, the lamination module 610 contains a top temperature sensor 602C that is adapted to measure the temperature of the top of the composite solar cell structure 304 and a bottom temperature sensor 602D that is adapted to measure the temperature of the bottom of the composite solar cell structure 304 during or after processing. In one embodiment, the top temperature sensor 602C and a bottom temperature sensor 602D are positioned one over another so that the difference in temperature between the top side and bottom side of the composite solar cell structure 304 can be simultaneously measured. In one embodiment, an array of pairs of temperature sensors 602C and 602D are positioned over desired areas of the composite solar cell structure 304 so that top and bottom temperature readings at different areas of the composite solar cell structure 304 can be measured.

Therefore, after performing the preheat process, a lamination process is performed in the lamination module 610. During the lamination process the composite solar cell structure 304 is controllably heated as it passes through the processing region 616 by use of the one more of the heating elements 601C and 601D disposed therein. In one embodiment, at least one of the top heating elements 601C and at least one of the bottom heating elements 601D are close loop controlled using the system controller 290 and at least one temperature sensor 602C positioned on the top of the composite solar cell structure 304 and at least one temperature sensor 602D positioned on the bottom of the composite solar cell structure 304. In one example, in which the bonding material is PVB, the lamination module temperature set point may be in a range between about 70° C. and about 105° C. After the substrate is heated in the lamination module a desired force is applied to one or more sides of the composite solar cell structure 304 by use of the one or more compression rollers 631B using one or more controlled force generating elements. The applied force supplied by the one or more compression rollers 631B may be between about 200 N/cm and about 600 N/cm.

Although heat and pressure are temporarily applied to the composite solar cell structure 304 in the bonding module 234, the level of heat and duration of pressure applied are generally not sufficient to completely cure the conductive adhesive disposed between the back contact layer 350 and the side-buss 355 in the bonding module 234. Therefore, the conductive adhesive is still capable of being compressed and further cured under pressure in a subsequent step (i.e., step 136), in order to achieve a repeatable high level of conductivity between the back contact layer 350 and the side-buss 355, such as about equivalent to that of a soldered connection.

Autoclave Module

As discussed above, in the autoclave step 136, the composite solar cell structure 304 is inserted in the processing region of the autoclave module 236 where heat and pressure are applied to the composite solar cell structure 304 to reduce the amount of trapped gas disposed between bonding material 360 and the back glass substrate 361, substrate 302, or the back contact layer 350 to prevent environmental attack of portions of the solar cell device through the regions of trapped gas. Use of the autoclave step 136 is also used to improve the properties of the bond between the substrate 302, back glass substrate 361, and bonding material 360. The processes performed in the autoclave step 136 are also useful to assure that the stress in the glass and bonding layer (e.g., PVB layer) are controlled to prevent future failures of the hermetic seal or failure of the glass due to the stress induced during the bonding/lamination process. Additionally, the processes performed in the autoclave step 131 are useful to cure the electrically conductive adhesive disposed between the back contact layer 350 and the side-buss 355 such that the conductivity between the two is increased versus standard curing processes.

Figure 7:
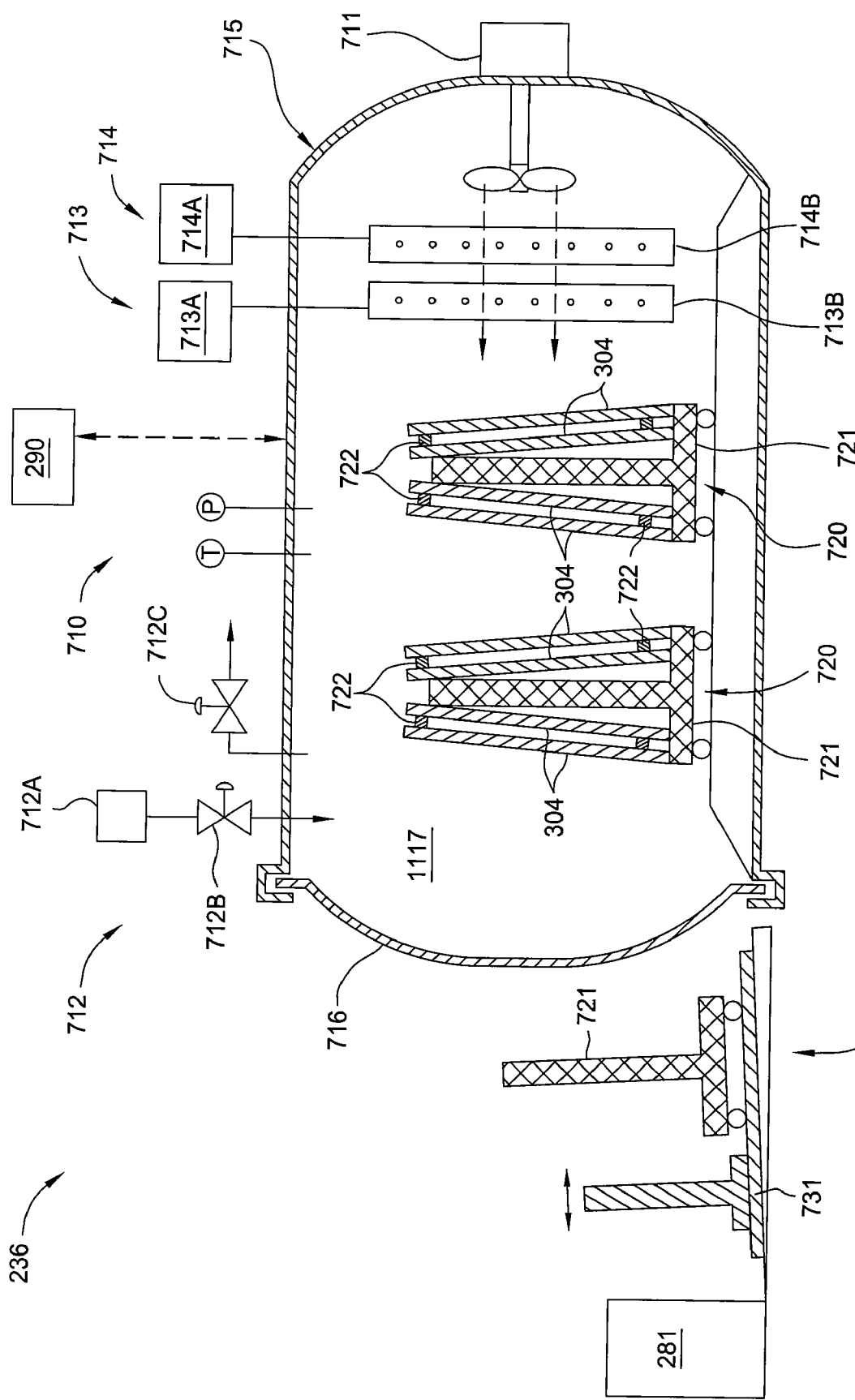
FIG. 7 illustrates a side cross-sectional view of one embodiment of an autoclave module and supporting equipment.

FIG. 7 illustrates a side cross-sectional view of one embodiment of an autoclave module 236 and supporting equipment. In one embodiment, the autoclave module 236 includes a vessel assembly 710, one or more substrate racks 720, and a loading system 730. The vessel assembly 710 generally contains a fluid movement device 711, a compressor 712, a heating unit 713, a cooling unit 714, and a vessel 715. The vessel 715 has a door 716 that is configured to enclose the substrate racks 720 and composite solar cell structures 304 disposed thereon in a processing region 1117 during processing. As shown in FIG. 7 the door 716 is closed and sealed against the vessel 715. The compressor 712, system controller 290, and pressure sensor "P" are used in combination to deliver and actively control the pressure within the processing region 1117 during the autoclave step 136 by controlling the delivery and release of a high pressure fluid from a fluid pump 712A, valve 712B, and relief valves 712C. In one embodiment, the compressor 712 is adapted to provide compressed air at pressure greater than about 13 bar to the processing region 1117 of the autoclave module 236 during processing. In another embodiment, the compressor 712 is adapted to provide compressed air at pressure between about 13 bar and about 15 bar to the processing region 1117 during processing.

To control the temperature of the composite solar cell structures 304 during the autoclave step 136, the system controller 290 and temperature sensor "T" are used in combination to control the amount of heat that is transferred to the composite solar cell structures 304 positioned in the processing region 1117 by use of the heating unit 713 and the cooling unit 714. The heating unit 713 generally contains a heater controller 713A and a plurality of heating elements 713B (e.g., thermally controlled resistance heating elements) that are in thermal communication with the composite solar cell structure(s) 304 disposed within the processing region 1117. Similarly, the cooling unit 714 contains a cooling unit controller 714A and a plurality of cooling elements 714B that are in thermal communication with the composite solar cell structure(s) 304 disposed within the processing region 1117. The cooling elements 714B may comprise a series fluid containing channels, in which a fluid exchanging medium is provided from the cooling unit controller 714A, to cool the components contained in the processing region 1117. In one example, the heating elements 713B and/or cooling elements 714B are disposed within the processing region 1117 and are adapted to add and/or remove heat from the composite solar cell structures 304 by convective heat transfer supplied by movement of the high pressure gas contained in the processing region 1117 during processing by use of the fluid movement device 711 (e.g., mechanical fan). The fluid movement device 711 is configured to provide motion to the fluid contained in the processing region 1117 during processing to also reduce the variation in temperature throughout the processing region 1117. In one embodiment, the temperature in the processing region is maintained between about 140° C. and about 160° C. for a time between about 1 and about 4 hours. The autoclave processing temperatures, pressures, and times will vary by the type of bonding material that is used, the type of conductive adhesive used, and as one or more process variables are altered.

In one embodiment, each composite solar cell structure 304 is heated and placed under isostatic pressure via the autoclave module 236. In one embodiment, the composite solar cell structure 304 is heated to a temperature from about 140° C. and about 160° C. under a pressure from about 13 bars to about 15 bars for a time period between about 1 and 4 hours in order to cure the conductive adhesive disposed between the back contact layer 350 and the side-buss 355.

The loading system 730 is generally configured to deliver and remove one or more of the racks 720 to the processing region 1117 of the vessel 715 prior to and after processing. The loading system 730 generally contains an automated material handling device 731, for example, a conveyor or a robotic device, which is used to transfer the racks 720 to and from the processing region 1117 of the vessel 715 in an automated fashion.

The one or more substrate racks 720 generally include one or more regions shelves 721 that are adapted to support the composite solar cell structures 304 during processing. In one embodiment, each substrate rack 720 contains wheels that allows the racks to be easily moved and positioned within the production line 200. Each of the composite solar cell structures 304 are spaced a desired distance apart to assure that temperature uniformity and pressures applied to the composite solar cell structures 304 are uniform. In one embodiment, to assure that the substrates see the same processing conditions one or more spacers 722 are disposed between and in contact with both adjacent composite solar cell structures 304 to assure that the spacing between the adjacent composite solar cell structures 304 is uniform. In one embodiment, three or more spacers are positioned between adjacent composite solar cell structures 304. In one example, the spacers 722 are adapted to space adjacent composite solar cell structures 304 between about 5 mm and about 15 mm apart.

In general, the autoclave module 236 may be transferrably connected to the automation device 281 positioned after the bonding module 234 to receive and perform the autoclave step 136 on one or more of the composite solar cell structures 304. The autoclave module 236 may also be transferrably connected to the automation device 281 positioned before the junction box attachment module 238 so that the processed composite solar cell structures 304 can be transferred to the down stream processing modules.

In one embodiment, as shown in FIG. 2, the composite solar cell structures 304 leaving the bonding module 234 are transferred to a substrate rack 720 that is then transferred to the autoclave module 236 for processing, and then transferred to a position near the junction box attachment module 238 after processing. As shown in FIG. 2, a plurality of substrate racks 720 are positioned to receive composite solar cell structures 304 from the automation device 281 positioned after the bonding module 234. In one embodiment, one or more robots (e.g., 6-axis robot) are positioned to transfer the composite solar cell structures 304 from the automation device 281, which is positioned after the bonding module 234, and on to a moveable substrate rack 720 by use of a robotic device (e.g., automated material handling device 731). Similarly, in one embodiment, the substrate racks 720 are moved from the autoclave module 236 to a position where a robot (e.g., 6-axis robot) is able to transfer the composite solar cell structures 304 from a substrate rack 720 and on to the automation device 281 positioned before the junction box attachment module 238. In one embodiment, the substrate rack 720 may be moved to and from the autoclave module 236 in an automated fashion.

Method of Forming an Electrical Connection with Electrically Conductive Adhesive Via Solar Cell Production Line Modules As previously set forth, steps 131-136 of the processing sequence 100 may be used to form an electrical connection on the device substrate 303 using electrically conductive adhesive in the bonding wire attach module 231, the bonding module 234, and the autoclave module 236. In one embodiment, the electrically conductive adhesive is applied to the back contact layer 350 of the device substrate 303 and the side-buss 355 is disposed thereover during the bonding wire attach step 131 in the bonding wire attach module 231. Next, the device substrate 303 has a bonding material 360 deposited over the back contact layer 350, having the conductive adhesive and side-buss 355 thereon, and a back glass substrate 361 placed over the bonding material 360 during the bonding preparation step 132 in the bonding preparation module 232 to form a composite solar cell structure 304. Next, the composite solar cell structure 304 is temporarily compressed under an applied heat during the bonding step 134 in the bonding module 134. Then, the composites solar cell structure 304 is subjected to heat and pressure for a duration adequate to completely cure the electrically conductive adhesive during the autoclave step 136 in the autoclave module 236. It has been found that the electrically conductive adhesive cured accordingly exhibits conductive properties on par with those of a soldered connection, which is significantly higher than those attainable when the electrically conductive adhesive is cured according to standard procedures at atmospheric pressure.

It is believed that curing the conductive adhesive under pressure also allows the adhesive elements (e.g., epoxy) in the conductive adhesive to maintain the spacing and distribution of the suspended conductive particles, which was achieved during the curing process while under pressure, after the curing process has been performed. It is also believed that by applying pressure to the conductive adhesive during curing also allows a more repeatable thickness of conductive adhesive to be disposed between the back contact layer 350 and the side-buss 355, due to the typical flow of the excess conductive adhesive from the space formed between the back contact layer 350 and the side-buss 355 when pressure is applied. The more repeatable thickness of adhesive tends to reduce the variation in electrical resistance through the individual beads of conductive adhesive (see reference numerals 500A-500B in FIG. 5) and from one formed solar cell 300 to another formed solar cell 300, thus improving the device yield of the production line 200.

Figure 8:
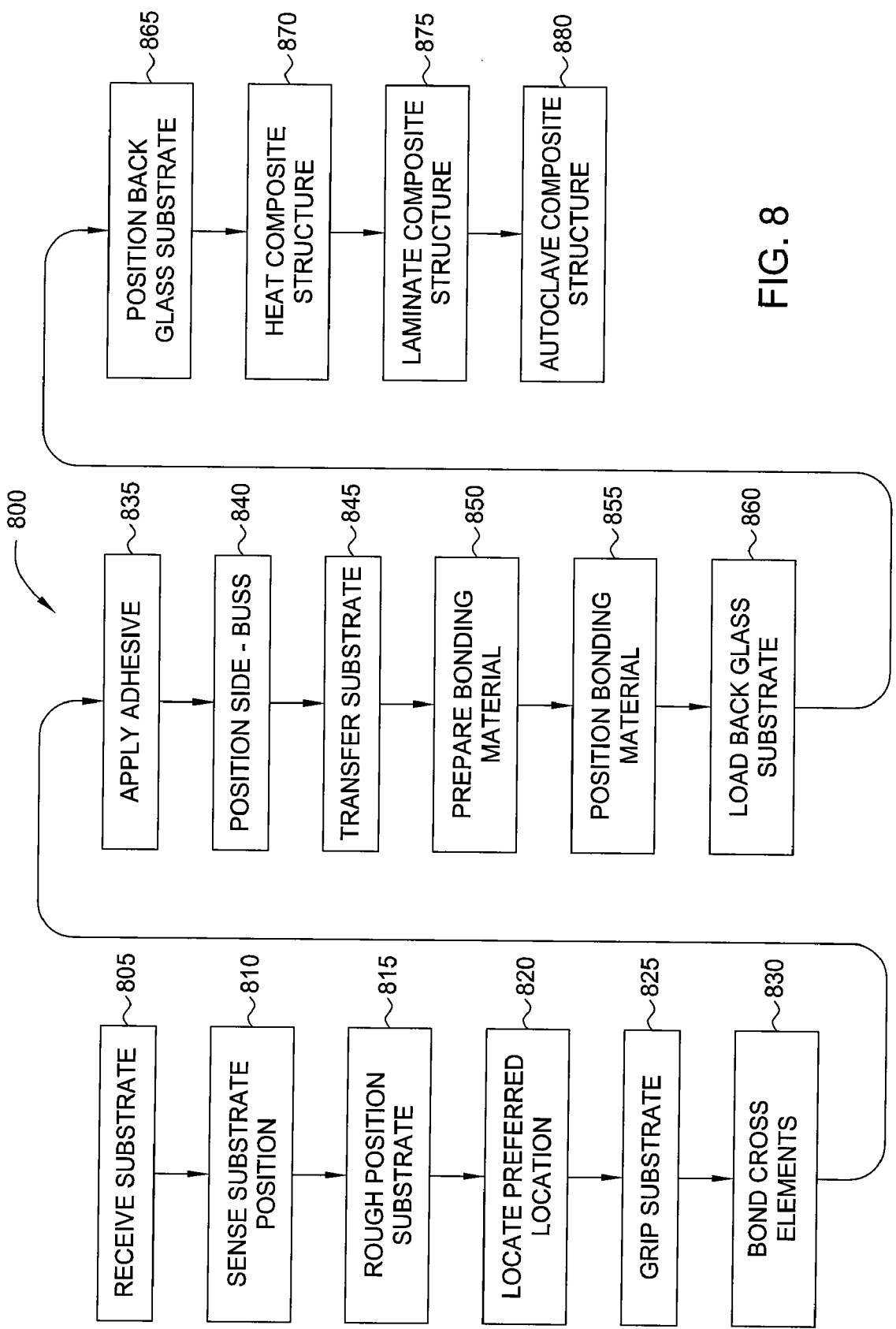
FIG. 8 schematically illustrates one embodiment of a process sequence for forming an electrical connection on a device substrate during the formation of a solar cell in a solar cell production line according to one embodiment.

FIG. 8 schematically illustrates one embodiment of a process sequence 800 that encompasses the steps 131-136 of the process sequence 100 for forming an electrical connection on a device substrate 303 during the formation of a solar cell 300 in the production line 200. As detailed above, embodiments of the invention may include a method and a device for electrically equipping a solar cell 300 such that the junction box 370 may be attached to external devices for reception of solar generated power. The configuration of the processing sequence, number of processing steps, order of processing steps, and arrangement of processing sequence 800 within the processing sequence 100 illustrated herein are not intended to limit the scope of the invention described herein.

The processing sequence 800 generally begins at step 805 in which one or more device substrates 303 are moved to an input region of the bonding wire attach module 231 by use of a robotic device so that the automated conveyor belts 421A can receive and position the device substrate 303. The automated conveyor belts 421A may also be adapted to receive a plurality of device substrates 303 that have been processed following steps 102-130. Movement of the device substrates 303 can be controlled by commands sent to one or more driving mechanisms coupled to the automated conveyor belts 421A from the system controller 290.

In step 810, the device substrate 303 may be moved along the automated conveyor belts 421A until the leading edge of the device substrate 303 is sensed by a moveable hard stop element and an optical sensor or a position sensor contained within the leading edge rough stop 425A. The leading edge is generally the edge of the device substrate 303 that is perpendicular to the direction of motion "$A_i$" and is first to advance into range of the leading edge rough stop 425A (FIG. 4A).

In step 815, the device substrate 303 may be lowered onto a gas cushion created by gas flowing through the plurality of holes formed in the plurality of frictionless support elements 421B. In one embodiment, the device substrate 303 is lowered onto the gas cushion by use of one or more actuators adapted to raise and lower the automated conveyor belts 421A. Once the device substrate 303 is positioned on the gas cushion, it may then be aligned to the Y-axis datum elements 424A by use of the pusher elements 424B. In one embodiment, servo motors in the Y-axis datum elements 424A and the pusher elements 424B are controlled to position the device substrate in a desired location within the bonding wire attach module 231.

Next, a size appropriate trailing edge rough stop 425B may be raised to engage the trailing edge of the device substrate 303. In one embodiment, the trailing edge rough stop 425B urges the device substrate against the leading edge rough stop 425A. In one embodiment, servo control of the Y-axis datum elements 424A, the trailing edge rough stop 425B, and the leading edge rough stop 425A allows the device substrate 303 to be positioned in the X and Y directions such that fine adjustments or corrections can be made in subsequent steps.

In step 820, an accurate location and alignment may be attained between features formed on the device substrate 303 and the automated components in the bonding wire attach module 231. In one embodiment, the X-direction, Y-direction, and angular alignment of the scribed trenches 381C (FIG. 3C) are aligned relative to the automation components in the bonding wire attach module 231. The X-direction, Y-direction, and angular alignment of the device substrate 303 may be adjusted by use of the data collected by the vision system 426 and control signals sent to the servo controlled Y-axis datum elements 424A, the trailing edge rough stop 425B, and the leading edge rough stop 425A by the system controller 290.

In step 825, once the device substrate 303 has been aligned, the device substrate 303 may then be grasped and retained by the gripping elements 425C. In one embodiment, once the gripping elements 425C have grasped a portion of the device substrate 303, the Y-axis datum elements 424A, the trailing edge rough stop 425B, and the leading edge rough stop 425A are disengaged from the device substrate 303 and are retracted. In one embodiment, the gripping elements 425C are then used to move the device substrate 303 along a known path through the bonding wire attach module 231 so that the cross-buss 356 and side-buss 355 elements can be accurately positioned in subsequent steps. In one embodiment, moving of the gripping elements 425C is controlled by commands received from the system controller 290. In one embodiment, the vision system 426 is used to recheck the position of the device substrate 303 after the gripping elements 425C have grasped a portion of the device substrate 303 to assure that the device substrate 303 is still in desirable alignment.

In step 830, the insulating material 357 and cross-busses 356 may be positioned in desired locations on the back contact layer 350 of the device substrate 303 via commands received from the system controller 290. In one embodiment, one or more lengths of the insulating material 357 and two cross-busses 356 are positioned on the surface of the device substrate 303 to form leads 362 that are used to deliver current from the side-busses 355 to the junction box 370 (FIG. 3C).

In one embodiment, step 830 comprises two major steps. First, the insulating material 357 is placed between the cross-busses 356 and the back contact layer 350 to prevent the cross-busses 356 from shorting out the active regions of the solar cell 300. In this step, the insulating material dispensing assembly 417 dispenses one or more desired lengths of the insulating material 357 on the surface of the device substrate 303. Second, the cross-buss dispensing assembly 418 dispenses one or more desired lengths of the cross-buss 356 on the surface of the insulating material 357.

In one embodiment, the process of dispensing the cross-buss 356 includes pressing the cross-buss 356, which has an adhesive disposed on one side, onto the surface of the insulating material 357 and then cutting the cross-buss 356 when a desired length has been positioned thereon. As shown in FIG. 3C, this step may require two lengths of cross-buss 356 material and one or more lengths of insulating material 357 to be affixed to the device substrate 303 to allow the formation of the two electrically isolated leads 362 that are separately connected to the active regions of the device substrate through each side-buss 355. In one embodiment, the placement and physical configuration of the cross-buss 356 and the insulating material 357 can be automatically adjusted solar-cell-to-solar-cell by use of commands received from the system controller 290.

In step 835, the conductive adhesive pattern 500 is applied to the surface of the back contact layer 350 via the adhesive dispensing module 432 in response to commands received from the system controller 290. In one embodiment, the conductive adhesive pattern 500 may comprise a continuous bead (500A, FIG. 5). In one embodiment, the conductive adhesive pattern 500 may comprise a line of beads dispensed at desired intervals (500B, FIG. 5). In one embodiment, a timer in the system controller 290 is triggered to ensure that the conductive adhesive is not cured prior to a subsequent pressure curing process (i.e., step 880) described below. In one embodiment, the conductive adhesive patterns 500 are simultaneously positioned onto opposing edges of the device substrate 303 by advancing the device substrate 303 in a desired direction "$A_i$" (FIGS. 4A and 4B).

In step 840, each side-buss 355 is positioned onto the conductive adhesive pattern 500 via the side-buss depositing element 431. In one embodiment, each side-buss 355 is placed in tension prior to or during placement onto the conductive adhesive pattern 500. In one embodiment, each side-buss 355 is lightly pressed onto the adhesive pattern 500 in order to break the surface tension of the adhesive and temporarily secure the side-buss 355 in place until subsequent pressurized curing steps can be completed. In one embodiment, strips of a nonconductive adhesive tape are placed across the side-buss 355 at desired intervals to temporarily secure the side-buss 355 in place until subsequent pressurized curing steps can be completed. In one embodiment, incremental lengths of both side-busses 355 are simultaneously positioned onto opposing edges of the device substrate 303 by advancing the device substrate 303 in a desired direction "$A_i$" (FIGS. 4A and 4B).

In step 845, the gripping elements 425C release the device substrate 303 and the automated conveyor belts 421A are raised to receive the device substrate 303 from the frictionless support elements 421B. After the device substrate 303 has been received by the automated conveyor belts 421A the gas flowing to the frictionless support elements 421B is turned off and the automated conveyor belts 421A move the device substrate 303 toward the next module in the processing sequence 100. Movement of the device substrate 303 can be controlled by commands sent to one or more driving mechanisms coupled to the automated conveyor belts 421A from the system controller 290.

In step 850, a bonding material 360 is prepared in the material preparation module 232A. In step 855, the bonding material 360 is then placed over the device substrate 303. In step 860, the back glass substrate 361 is loaded into the loading module 232B and washed by the cleaning module 232C. In step 865, the back glass substrate 361 is then placed over the bonding material 360 and the device substrate 303 to form a composite solar cell structure 304.

In step 870, the composite solar cell structure 304 is advanced into the preheat module 611 of the bonding module 234. The composite solar cell structure 304 is heated via the heating elements 601A and 601B as it is advanced through the preheat module 611 via support rollers 621. In one example, in which the bonding material is PVB, the lamination module temperature set point may be in a range between about 40° C. and about 60° C. After the composite solar cell structure 304 is preheated, it is advanced through the compression rollers 631A. In one embodiment, the advancement, heating, and compression of the composite solar cell structure 304 is controlled by commands received from the system controller 290. In one example, the applied force supplied by the compression rollers 631A may be between about 200 N/cm and about 600 N/cm. Typically, the substrate is maintained at the process pressure and temperature in the preheat module less than about 30 seconds.

In step 875, the composite solar cell structure 304 is advanced into the lamination module 610 of the bonding module 234. The composite solar cell structure 304 is again heated via the heating elements 601C and 601D as it is advanced through the lamination module 610. In one example, in which the bonding material is PVB, the lamination module temperature set point may be in a range between about 70° C. and about 105° C. After the composite solar cell structure 304 is heated, a desired compression force is applied to the composite solar cell structure 304 via the compression rollers 631B sufficient to laminate the composite solar cell structure 304 without fully curing the conductive adhesive disposed between the back contact layer 350 and the side-buss 355 of the solar cell structure 304. In one embodiment, the advancement, heating, and compression of the composite solar cell structure 304 is controlled by commands received from the system controller 290. In one example, the applied force supplied by the compression rollers 631B may be between about 200 N/cm and about 600 N/cm. Typically, the substrate is maintained at the process pressure and temperature in the lamination module less than about 30 seconds.

In step 880, the composite solar cell structure 304 is transported into the processing region 1117 of the vessel assembly 710 of the autoclave module 236. In one embodiment, the composite solar cell structure 304 is heated and placed under isostatic pressure via the autoclave module 236. In one embodiment, the composite solar cell structure 304 is heated to a temperature from about 140° C. and about 160° C. under a pressure from about 11 bars to about 15 bars for a time period between about 1 and 4 hours in order to reduce the trapped gasses within the composite solar cell structure 304 and to cure the conductive adhesive disposed between the back contact layer 350 and the side-buss 355. In one embodiment, the temperature, pressure, and duration of autoclave processes performed on the composite solar cell substrate 304 is controlled by the system controller 290.

In one embodiment, the system controller 290 is configured to control the timing between the application of the conductive adhesive in step 835 and the curing of the conductive adhesive in step 880 to ensure that the conductive adhesive does not cure prematurely. For instance, in one embodiment, the conductive adhesive cures within about 60 hours of application when maintained at room temperature and atmospheric pressure. However, the conductive adhesive cures within one to four hours if maintained at a temperature of about 150° C. for about two hours. In this example, the system controller 290 ensures that each composite solar cell structure 304 in the production line 200 completes the process sequence 800 within 60 hours to ensure that the conductive adhesive is properly cured under high pressure and high heat rather than at atmospheric pressure and at room temperature as is the current state-of-art.

In one embodiment of the present invention, it has been found that curing the adhesive having conductive particles contained therein at high pressures significantly reduces the electrical resistance of the formed electrical connection. In one embodiment, it has been found that curing the electrically conductive adhesive at high pressures provides electrical resistance about equivalent to that of a conventionally soldered electrical connection.

Figure 9A:
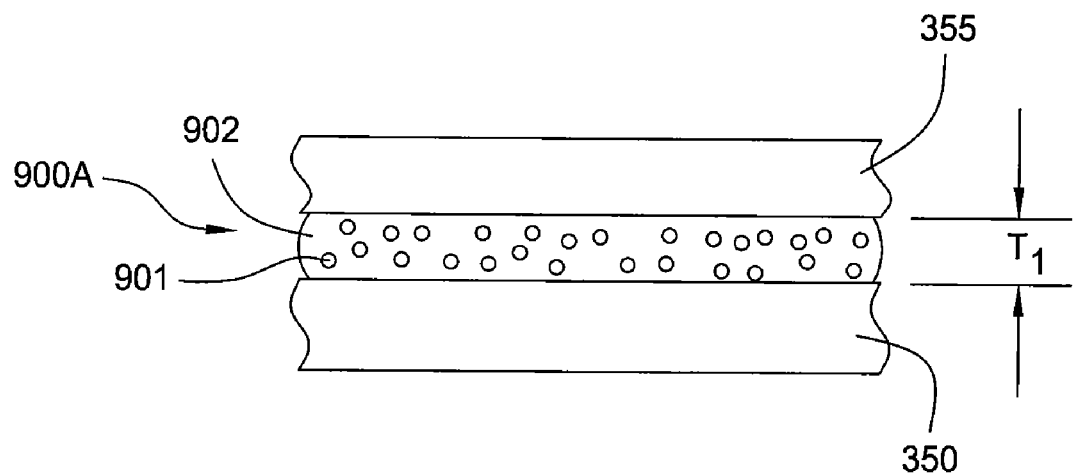
FIG. 9A is a partial schematic cross-sectional view of a solar cell having the back contact layer bonded to the side-buss via a conductive adhesive, which is conventionally cured at atmospheric pressure and at high temperature.
Figure 9B:
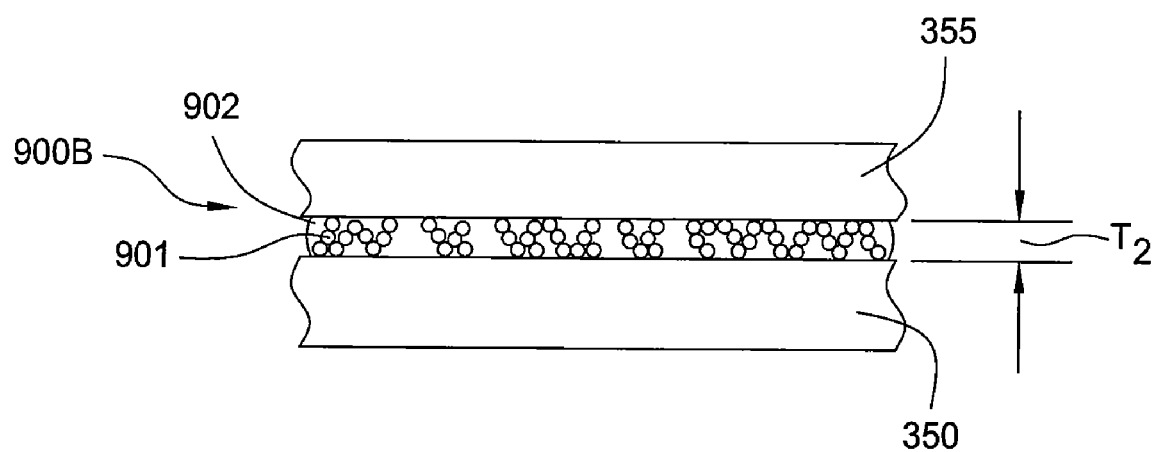
FIG. 9B is a partial schematic cross-sectional view of a solar cell having the back contact layer bonded to the side-buss via a conductive adhesive, which is cured according to one embodiment of the present invention under high pressure.

One possible explanation for this finding is illustrated in FIGS. 9A and 9B. FIG. 9A is a partial schematic cross-sectional view of a solar cell 300 having the back contact layer 350 bonded to the side-buss 355 via a conductive adhesive 900A, which is conventionally cured at atmospheric pressure and at high temperature. The conductive adhesive 900A comprises conductive particles 901 dispersed in a polymer 902. It is thought that during conventional curing (i.e., at or near atmospheric pressure), the conductive particles 901 remain randomly spaced. As such, electrical current flowing from the back contact layer 350 to the side-buss 355 must travel through a significant amount of polymer 902 as it passes from conductive particle 901 to conductive particle 901 on its path. It is though that the passage of current through the polymer 902 increases the resistance along its path.

Also, the thickness ($t_1$) of the conductive adhesive 900A disposed between the back contact layer 350 and the side-buss 355 is greater, and varies more, than the thickness ($t_2$) of the temperature and pressure cured conductive adhesive 900B, discussed below. It is believed that the greater thickness and greater variation in thickness is due to the typically minimal application of force and short duration of force applied between the side-buss 355, the uncured conductive adhesive 900A, and the back contact layer 350 during the process of placing the side-buss 355 in contact with the adhesive 900A and the variation in the conductive adhesive's mechanical properties, such as viscosity, which is a function of temperature and time of exposure to atmosphere (e.g., curing time).

FIG. 9B is a partial schematic cross-sectional view of a solar cell 300 having the back contact layer 350 bonded to the side-buss 355 via the conductive adhesive 900B, which is cured according to one embodiment of the present invention under high pressure. The conductive adhesive 900B comprises the conductive particles 901 dispersed in the polymer 902. It is thought that during high pressure curing, according to one embodiment of the present invention, the conductive particles 901 are placed in a closer alignment as shown in FIG. 9B. As a result, electrical current flowing from the back contact layer 350 to the side-buss 355 travels directly through the aligned conductive particles 901 with significantly less resistance from the polymer 902 than that of the conventionally cured conductive adhesive 900A depicted in FIG. 9A. As noted above, it is also believed that by applying pressure to the conductive adhesive 900B during curing allows a more repeatable thickness ($t_2$) of conductive adhesive to be formed between the back contact layer 350 and the side-buss 355, due to the typical flow of the excess conductive adhesive from the space formed between the back contact layer 350 and the side-buss 355 when the pressure is applied.

Figure 10:
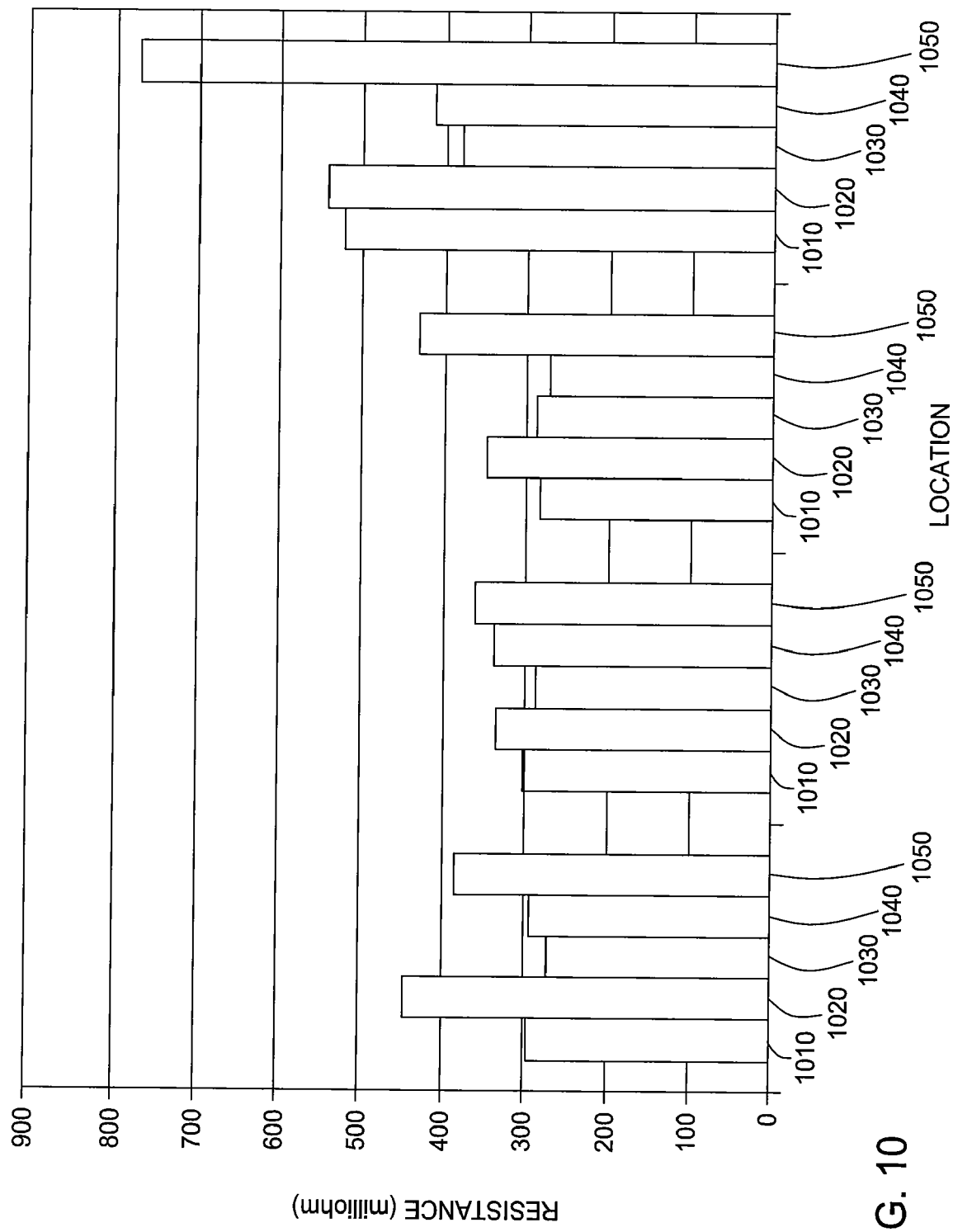
FIG. 10 is a bar graph comparing resistance test data of electrical connections formed using a conductive adhesive under pressurized curing according to embodiments of the present invention with electrical connections formed with the conductive adhesive conventionally cured and with conventional soldered connections.

FIG. 10 is a bar graph comparing resistance test data of electrical connections formed using a conductive adhesive under pressurized curing according to embodiments of the present invention with electrical connections formed with the conductive adhesive conventionally cured and with soldered connections. The resistance measurements of the soldered connections are represented by the numeral 1010. The resistance measurements of the conductive adhesive connections cured with high heat (about 150° C.) without added pressure are represented by the numeral 1020. The resistance measurements of the conductive adhesive connections cured under pressure (about 13 bar) at high heat (about 150° C.) according to one embodiment of the present invention are represented by the numeral 1030. The resistance measurements of the conductive adhesive connections cured under pressure (about 13 bar) at moderate heat (about 80° C.) according to one embodiment of the present invention are represented by the numeral 1040. The resistance measurements of the conductive adhesive connections cured with moderate heat (about 80° C.) without added pressure are represented by the numeral 1050. As can be seen, the electrical connections formed with the electrically conductive adhesive cured under pressure exhibit significantly lower resistance than those with the electrically conductive adhesive cured at atmospheric pressure. Additionally, the electrical connections formed with the electrically conductive adhesive cured under pressure exhibit resistivity on par with that of the conventionally soldered connections.

Therefore, electrical connections formed with electrically conductive adhesive cured at high pressure according to embodiments of the present invention provide significantly greater conductivity than those formed with electrically conductive adhesive cured according to conventional methods. Moreover, the electrical connections formed according to embodiments of the present invention exhibit electrical conductivity approximately equivalent to soldered connections without the potential detrimental effects of the localized heating associated with soldering and the high cost of maintaining soldering modules in a production line environment.

While the foregoing is directed to embodiments of the present invention, other and further embodiments of the invention may be devised without departing from the basic scope thereof, and the scope thereof is determined by the claims that follow.

What is claimed is:

1. A method of forming an electrical connection, comprising:
   dispensing an electrically conductive adhesive onto a surface of a first conductive member;
   positioning a second conductive member onto the electrically conductive adhesive;
   positioning a polymeric material over the first and second conductive members;
   disposing a substrate over the polymeric material to form a composite structure;
   compressing the composite structure at a pressure substantially exceeding atmospheric pressure; and
   curing the electrically conductive adhesive while compressing the composite structure.

2. The method of claim 1, further comprising applying heat to the composite structure during curing the electrically conductive adhesive.

3. The method of claim 2, wherein compressing the composite structure further comprises compressing the composite structure at a pressure between about 11 bar and about 15 bar.

4. The method of claim 3, wherein compressing the composite structure further comprises compressing the composite structure for between about 1 hour and about 4 hours.

5. The method of claim 4, wherein compressing the composite structure further comprises isostatically compressing the composite structure.

6. The method of claim 5, wherein applying heat comprises applying heat at a temperature between about 140° C. and about 160° C.

7. The method of claim 6, wherein the conductive adhesive comprises an epoxy having conductive particles disposed therein, wherein the conductive particles are selected from the group consisting of silver, gold, copper, nickel, carbon, and graphite.

8. The method of claim 6, wherein the first conductive element comprises a substrate having one or more silicon layers formed thereover and a back contact layer formed over the one or more silicon layers.

9. The method of claim 8, wherein the second conductive element comprises a side-buss wire.

10. A method of forming an electrical connection, comprising:
    dispensing an electrically conductive adhesive onto a surface of a back contact layer of a solar cell substrate, wherein the solar cell substrate comprises:
    a glass substrate;
    a transparent conductive layer deposited over the glass substrate;
    one or more silicon layers deposited over the transparent conductive layer; and
    a back contact layer deposited over the one or more silicon layers;
    positioning a portion of a side-buss onto a portion of the electrically conductive adhesive;
    positioning a polymeric material over the back contact layer and the side-bus;
    disposing a back glass substrate over the polymeric material to form a composite structure;
    compressing the composite structure at a pressure substantially exceeding atmospheric pressure; and
    curing the electrically conductive adhesive while compressing the composite structure.

11. The method of claim 10, further comprising applying heat to the composite structure between about 140° C. and about 160° C. during curing the electrically conductive adhesive.

12. The method of claim 11, wherein compressing the composite structure further comprises compressing the composite structure at a pressure between about 11 bar and about 15 bar for between about 1 hour and about 4 hours.

13. The method of claim 12, wherein the conductive adhesive comprises an epoxy having conductive particles contained therein, wherein the conductive particles are selected from the group consisting of silver, gold, copper, nickel, carbon, and graphite.

14. A method of forming an electrical connection, comprising:
dispensing an electrically conductive adhesive onto a surface of a back contact layer of a solar cell substrate in a bonding wire attach module of a solar cell production line, wherein the conductive adhesive comprises an epoxy having conductive particles dispersed therein, and wherein the solar cell substrate comprises:
a glass substrate;
a transparent conductive layer deposited over the glass substrate;
one or more silicon layers deposited over the transparent conductive layer;
a back contact layer deposited over the one or more silicon layers; and
a cross-buss disposed over the back contact layer such that the cross-buss is insulated from the back contact layer;
positioning a portion of a side-buss onto a portion of the electrically conductive adhesive;
positioning a polymeric material over the back contact layer and the side-buss;
disposing a back glass substrate over the polymeric material to form a composite structure;
compressing the composite structure at a pressure substantially exceeding atmospheric pressure;
curing the electrically conductive adhesive while compressing the composite structure in an autoclave module of the solar cell production line; and
controlling the timing between dispensing the electrically conductive adhesive and curing the electrically conductive adhesive via a system controller in the solar cell production line.

15. The method of claim 14, further comprising applying heat at a temperature between about 140° C. and about 160° C. to the composite structure during curing the electrically conductive adhesive in the autoclave module of the solar cell production line.

16. The method of claim 15, wherein compressing the composite structure further comprises isostatically compressing the composite structure at a pressure between about 11 bar and about 15 bar for a time period between about 1 hour and about 4 hours in the autoclave module of the solar cell production line.

17. The method of claim 16, further comprising laminating the composite structure in a lamination module of the solar cell production line prior to compressing the composite structure.

18. The method of claim 17, wherein laminating the composite structure comprises preheating the composite structure and compressing the composite structure via compression rollers.

19. The method of claim 18, wherein the conductive particles are selected from the group consisting of silver, gold, copper, nickel, carbon, and graphite.

* * * * *